US012681385B2

(12) United States Patent
Kim et al.

(10) Patent No.: US 12,681,385 B2
(45) Date of Patent: Jul. 14, 2026

(54) PHOTOSENSITIVE RESIN COMPOSITION AND MANUFACTURING METHOD OF DISPLAY DEVICE USING THE SAME

(71) Applicants: Samsung Display Co., Ltd., Yongin-si (KR); LTC Co., Ltd, Hwaseong-si (KR)

(72) Inventors: Jun Young Kim, Hwaseong-si (KR); Gwui-Hyun Park, Hwaseong-si (KR); Koichi Sugitani, Suwon-si (KR); Hye In Kim, Hwaseong-si (KR); Do Hyuk Im, Hwaseong-si (KR); Saehee Han, Paju-si (KR); Pil Soon Hong, Seoul (KR); Hwa Young Kim, Hwaseong-si (KR); Do Hyun Seo, Hwaseong-si (KR); Ho Sung Choi, Hwaseong-si (KR); Sung Goo Han, Hwaseong-si (KR)

(73) Assignees: Samsung Display Co., Ltd., Yongin-si (KR); LTC Co., Ltd, Hwaseong-si (KR)

( * ) Notice: Subject to any disclaimer, the term of this patent is extended or adjusted under 35 U.S.C. 154(b) by 19 days.

(21) Appl. No.: 17/867,443

(22) Filed: Jul. 18, 2022

(65) Prior Publication Data

US 2023/0096077 A1 Mar. 30, 2023

(30) Foreign Application Priority Data

Sep. 27, 2021 (KR) ........................ 10-2021-0126823

(51) Int. Cl.
*G03F 7/023* (2006.01)
*G03F 7/004* (2006.01)
(Continued)

(52) U.S. Cl.
CPC .......... *G03F 7/0233* (2013.01); *G03F 7/0048* (2013.01); *G03F 7/0395* (2013.01); *G03F 7/0757* (2013.01); *G03F 7/30* (2013.01)

(58) Field of Classification Search
CPC ......... G03F 7/0233; G03F 7/0757; G03F 7/30
See application file for complete search history.

(56) References Cited

U.S. PATENT DOCUMENTS

| | | | |
|---|---|---|---|
| 6,593,043 B2 | 7/2003 | Suwa et al. | |
| 7,507,518 B2 | 3/2009 | Fujita et al. | |

(Continued)

FOREIGN PATENT DOCUMENTS

| | | | | |
|---|---|---|---|---|
| CN | 101515113 B * | 7/2012 | .............. C08F 22/00 |
| KR | 10-2009-0089802 A | 8/2009 | |

(Continued)

*Primary Examiner* — John S. Chu
(74) *Attorney, Agent, or Firm* — Womble Bond Dickinson (US) LLP

(57) ABSTRACT

A photosensitive resin composition including a silsesquioxane-based copolymer obtained by copolymerizing a first monomer represented by Chemical Formula 1 ($R_1$—$R_2$—$Si(R_3)_3$), a second monomer represented by Chemical Formula 2 ($(R_4)_n$—$Si(R_5)_{4-n}$), a third monomer represented by Chemical Formula 3 ($Si(R_6)_4$), and a fourth monomer represented by Chemical Formula 4 ($(R_7)_3$—Si—$R_8$—Si—$(R_7)_3$) are provided.

18 Claims, 13 Drawing Sheets

(51) Int. Cl.

| | |
|---|---|
| ***G03F 7/039*** | (2006.01) |
| ***G03F 7/075*** | (2006.01) |
| ***G03F 7/30*** | (2006.01) |

(56) References Cited

U.S. PATENT DOCUMENTS

| | | | | |
|---|---|---|---|---|
| 8,507,171 | B2 | 8/2013 | Kimura et al. | |
| 10,409,162 | B2 | 9/2019 | Kim et al. | |
| 11,561,472 | B2 * | 1/2023 | Nakajima | G03F 7/36 |
| 2010/0006843 | A1 | 1/2010 | Lee et al. | |
| 2014/0048131 | A1 * | 2/2014 | Tanaka | H01L 31/022466<br>174/250 |
| 2018/0181000 | A1 * | 6/2018 | Nakajima | G03F 7/0757 |

FOREIGN PATENT DOCUMENTS

| | | | |
|---|---|---|---|
| KR | 10-1520793 | B1 | 5/2015 |
| KR | 10-1688470 | B1 | 12/2016 |
| KR | 10-2018-0016986 | A | 2/2018 |
| KR | 10-1930367 | B1 | 12/2018 |
| KR | 10-2020-0083366 | A | 7/2020 |

* cited by examiner

PHOTOSENSITIVE RESIN COMPOSITION AND MANUFACTURING METHOD OF DISPLAY DEVICE USING THE SAME

CROSS-REFERENCE TO RELATED APPLICATION

This application claims priority to and the benefit of Korean Patent Application No. 10-2021-0126823, filed on Sep. 27, 2021, the entire content of which is hereby incorporated by reference.

BACKGROUND

1. Field

The present disclosure herein relates to a photosensitive resin composition, and for example, to a photosensitive resin composition and a manufacturing method of a display device utilizing the same.

2. Description of the Related Art

Various electronic devices such as televisions, mobile phones, tablet computers, navigation systems, and game consoles may have a display device for displaying images.

A photolithography process for forming a pattern is applied in the manufacture of a display device, and at this time, a photosensitive material is utilized. For example, a protective film, an insulating film, a column spacer, an overcoat layer, a color filter layer, etc., may be formed of the photosensitive material. According to a composition of the photosensitive material, the resolution, transmittance, heat resistance, chemical resistance, and residual film rate of a pattern or film which is formed of the photosensitive material may be determined or selected.

Recently, to simplify a process, methods of forming an organic film having a pattern by directly patterning a photosensitive organic material, for example, a photosensitive resin composition, are being studied.

SUMMARY

Aspects of embodiments of the present disclosure provide a photosensitive resin composition having high sensitivity, high resolution, high transparency, high heat-resistance, and/or low dielectric characteristics, and a manufacturing method of a display device utilizing the same.

An embodiment of the present disclosure provides a photosensitive resin composition including a silsesquioxane-based copolymer obtained by copolymerizing a first monomer represented by Chemical Formula 1, a second monomer represented by Chemical Formula 2, a third monomer represented by Chemical Formula 3, and a fourth monomer represented by Chemical Formula 4.

$R_1—R_2—Si(R_3)_3$  Chemical Formula 1

$(R_4)_n—Si(R_5)_{4-n}$  Chemical Formula 2

$Si(R_6)_4$  Chemical Formula 3

$(R_7)_3—Si—R_8—Si—(R_7)_3$  Chemical Formula 4

In Chemical Formulas 1 to 4, $R_1$ may be a substituted or unsubstituted mercapto group, or a substituted or unsubstituted furanyl group, $R_2$ may be a direct linkage, or a substituted or unsubstituted divalent alkyl group having three to six carbon atoms, $R_3$, and $R_5$ to $R_7$ may each independently be a substituted or unsubstituted alkoxy group having one to three carbon atoms, $R_4$ may be a substituted or unsubstituted alkyl group having one to three carbon atoms, or a substituted or unsubstituted aryl group having six to twelve ring-forming carbon atoms, $R_8$ may be a substituted or unsubstituted arylene group having six to twelve ring-forming carbon atoms, and n may be an integer from one to three.

In an embodiment, the silsesquioxane-based copolymer may have a weight average molecular weight of about 5000 to about 15000.

In an embodiment, the silsesquioxane-based copolymer may have a dispersity of about 2.0 to about 4.0.

In an embodiment, the silsesquioxane-based copolymer may include a repeating unit in which the combination order of the first monomer, the second monomer, the third monomer, and the fourth monomer is random.

The first monomer may include a (1-1)-st monomer and a (1-2)-nd monomer different from the (1-1)-st monomer, and the (1-1)-st monomer may be represented by Chemical Formula 1-1, and the (1-2)-nd monomer may be represented by Chemical Formula 1-2.

$R_{1-1}—R_2—Si(R_3)_3$  Chemical Formula 1-1

$R_{1-2}—R_2—Si(R_3)_3$  Chemical Formula 1-2

In Chemical Formula 1-1 and Chemical Formula 1-2, $R_{1-1}$ may be a substituted or unsubstituted mercapto group, and $R_{1-2}$ may be a substituted or unsubstituted furanyl group.

In Chemical Formula 1-1 and Chemical Formula 1-2, the same description as defined in Chemical Formula 1 may be applied to $R_2$ and $R_3$.

In an embodiment, the second monomer represented by Chemical Formula 2 may be represented by Chemical Formula 2-1 or Chemical Formula 2-2.

$R_4—Si(R_5)_3$  Chemical Formula 2-1

$(R_4)_2—Si(R_5)_2$  Chemical Formula 2-2

In Chemical Formula 2-1 and Chemical Formula 2-2, the same description as defined in Chemical Formula 2 may be applied to $R_4$ and $R_5$.

In an embodiment, the first monomer may include at least one of 3-(mercapto)propyltrimethoxysilane, or trimethoxy(2-furanyl)silane.

In an embodiment, the second monomer may include at least one of methyltrimethoxysilane, propyltrimethoxysilane, phenyltrimethoxysilane, diphenyldimethoxysilane, or diphenyldiethoxysilane.

In an embodiment, the third monomer may include at least one of tetramethoxysilane, tetraethoxysilane, or tetrapropoxysilane.

In an embodiment, the fourth monomer may include at least one of 1,4-bis(triethoxysilyl)benzene, 1,3-bis(triethoxysilyl)benzene, or 4,4-bis(triethoxysilyl)-1,1'-biphenyl.

In an embodiment, the silsesquioxane-based copolymer may include a repeating unit represented by Chemical Formula 5.

Chemical Formula 5

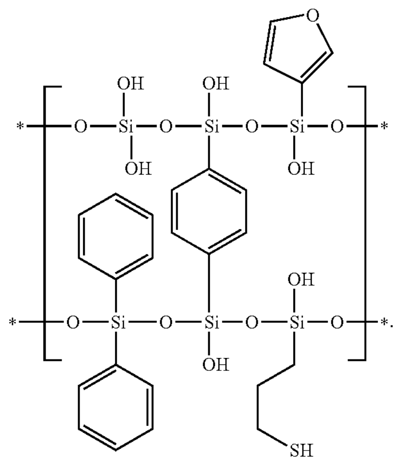

In an embodiment, with respect to the total amount of the first monomer, the second monomer, the third monomer, and the fourth monomer, about 5% to about 25% by weight of the first monomer, about 20% to about 60% by weight of the second monomer, about 20% to about 40% by weight of the third monomer, and about 5% to about 25% by weight of the fourth monomer may be included.

In an embodiment, the photosensitive resin composition may further include a quinonediazide-based photosensitive compound and a glycol-based solvent, wherein, with respect to the total amount of the photosensitive resin composition, about 10% to about 40% by weight of the silsesquioxane-based copolymer, about 5% to about 20% by weight of the quinonediazide-based photosensitive compound, and about 40% to about 85% by weight of the glycol-based solvent may be included.

In an embodiment, the quinonediazide-based photosensitive compound may include at least one of 1,4-benzenediol, 1,2-benzenediol, 4,4'-dihydroxy-biphenyl, bisphenol-A, α,α-bis(4-hydroxyphenyl)-4-(4-hydroxy-α,α-dimethylbenzyl)-ethylbenzene, or 4,4',4"-trihydroxyphenylmethane which contains, as a substituent, a naphthoquinone-1,2-diazide-4-sulfonic acid ester group or a naphthoquinone-1,2-diazide-5-sulfonic acid ester group.

In an embodiment, the glycol-based solvent may include at least one of butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

In an embodiment of the present disclosure, a photosensitive resin composition may include a silsesquioxane-based copolymer obtained by copolymerizing a first monomer, a second monomer, a third monomer, and a fourth monomer which are different from each other, a quinonediazide-based photosensitive compound, a surfactant, and a glycol-based solvent, wherein the first monomer is represented by Chemical Formula 1.

In an embodiment of the present disclosure, a manufacturing method of a display device includes forming an organic insulating layer on a base layer, and forming a pixel-defining layer (e.g., film) on the organic insulating layer, wherein at least one of the organic insulating layer or the pixel-defining film is formed of a photosensitive resin composition, and the photosensitive resin composition includes a silsesquioxane-based copolymer obtained by copolymerizing a first monomer represented by Chemical Formula 1, a second monomer represented by Chemical Formula 2, a third monomer represented by Chemical Formula 3, and a fourth monomer represented by Chemical Formula 4.

In an embodiment, the forming of the organic insulating layer may include forming a preliminary organic insulating layer by coating the base layer with the photosensitive resin composition, and selectively exposing and developing the preliminary organic insulating layer.

In an embodiment, the forming of the pixel-defining film may include forming a preliminary pixel-defining film by coating the organic insulating layer with the photosensitive resin composition, and selectively exposing and developing the preliminary pixel-defining film.

BRIEF DESCRIPTION OF THE DRAWINGS

The accompanying drawings are included to provide a further understanding of the present disclosure, and are incorporated in and constitute a part of this disclosure. The drawings illustrate embodiments of the present disclosure and, together with the disclosure serve to explain principles of the present disclosure. In the drawings.

DETAILED DESCRIPTION

Figure 1:
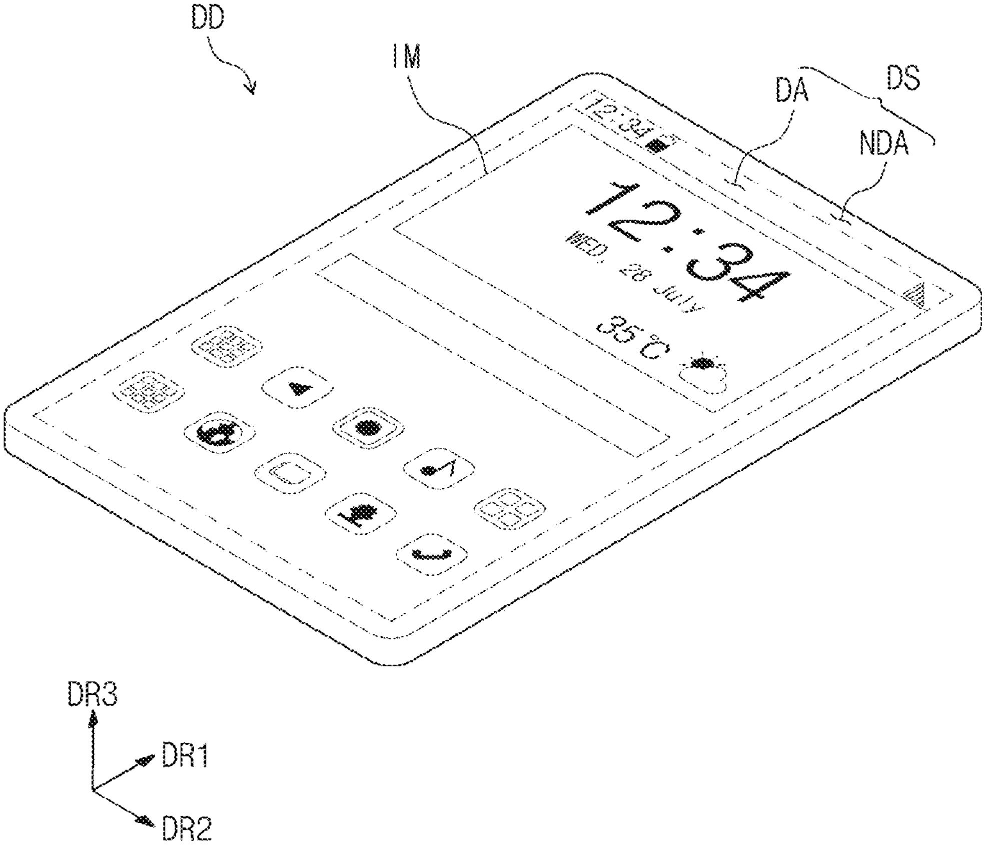
FIG. 1 is a perspective view of a display device according to an embodiment of the present disclosure.

Hereinafter, embodiments of the present disclosure will be described with reference to the accompanying drawings.

In this disclosure, when a component (or region, layer, portion, etc.) is referred to as "on", "connected", or "coupled" to another component, it refers to that it is placed/connected/coupled directly on the other component or a third component can be between them.

The same reference numerals or symbols refer to the same elements. In some embodiments, in the drawings, thicknesses, ratios, and dimensions of components may be exaggerated for effective description of technical content (e.g., amount). "And/or" includes all combinations of one or more that the associated elements may define.

Terms such as first and second may be utilized to describe one or more suitable components, but the components should not be limited by the terms. These terms are only utilized for the purpose of distinguishing one component from other components. For example, without departing from the scope of the present disclosure, a first component may be referred to as a second component, and similarly, a second component may be referred to as a first component. Singular expressions include plural expressions unless the context clearly indicates otherwise.

In some embodiments, terms such as " ", "lower", "above", and "upper" are utilized to describe the relationship between components shown in the drawings. The terms are relative concepts and are described based on the directions indicated in the drawings.

In the present disclosure, terms such as "comprise", "include" or "have" are intended to designate the presence of features, numbers, steps, actions, components, parts, or combinations thereof described in the specification. It should be understood that the possibility of the presence or addition of one or more other features or numbers, steps, actions, components, parts, or combinations thereof is not excluded in advance.

In the present disclosure, "directly in contact" may refer to that there is no layer, film, region, plate, etc. added between a portion such as a layer, film, region, or plate and another portion. For example, "direct contact" may refer to placing two layers or two members without utilizing an additional member such as an adhesive member therebetween.

Unless otherwise defined, all terms (including technical and scientific terms) utilized herein have the same meaning as commonly understood by one of ordinary skill in the art to which this present disclosure belongs. In some embodiments, terms such as terms defined in commonly utilized dictionaries should be interpreted as having a meaning consistent with the meaning in the context of the related technology, and unless interpreted as an ideal or excessively formal meaning, should be explicitly defined herein.

Hereinafter, a photosensitive resin composition according to an embodiment of the present disclosure, and a manufacturing method of a display device utilizing the same will be described with reference to the accompanying drawings.

FIG. 1 is a perspective view of a display device according to an embodiment of the present disclosure.

In the present disclosure, a cellular phone terminal is illustrated as an example of a display device DD. The display device DD according to an embodiment of the present disclosure may be applied not only to large-sized electronic devices such as televisions, and monitors, but also to small- and medium-sized electronic devices such as tablet computers, car navigations, game consoles, and smart watches.

Referring to FIG. 1, the display device DD may display an image IM through a display surface DS. Icon images are illustrated as an example of the image IM. A display surface DS is parallel (substantially parallel) to a plane defined by a first direction DR1 and a second direction DR2. The normal direction of the display surface DS, for example, the thickness direction of the display device DD indicates a third direction DR3.

The display surface DS includes a display region DA in which an image IM is displayed, and a non-display region NDA adjacent to the display region DA. The non-display region NDA is a region in which an image is not displayed, but an embodiment of the present disclosure is not limited thereto. The non-display region NDA may be adjacent to any side of the display region DA, or not be provided.

In the present disclosure, "when seen from a plane, or on a plane" (e.g., in a plan view) may refer to when seen in the third direction DR3. A front surface (or upper surface) and a rear surface (or lower surface) of each layer or unit to be described are defined based on the third direction DR3. However, the combination of the first to third directions DR1, DR2, and DR3 may be changed to other combinations thereof.

Figure 2:
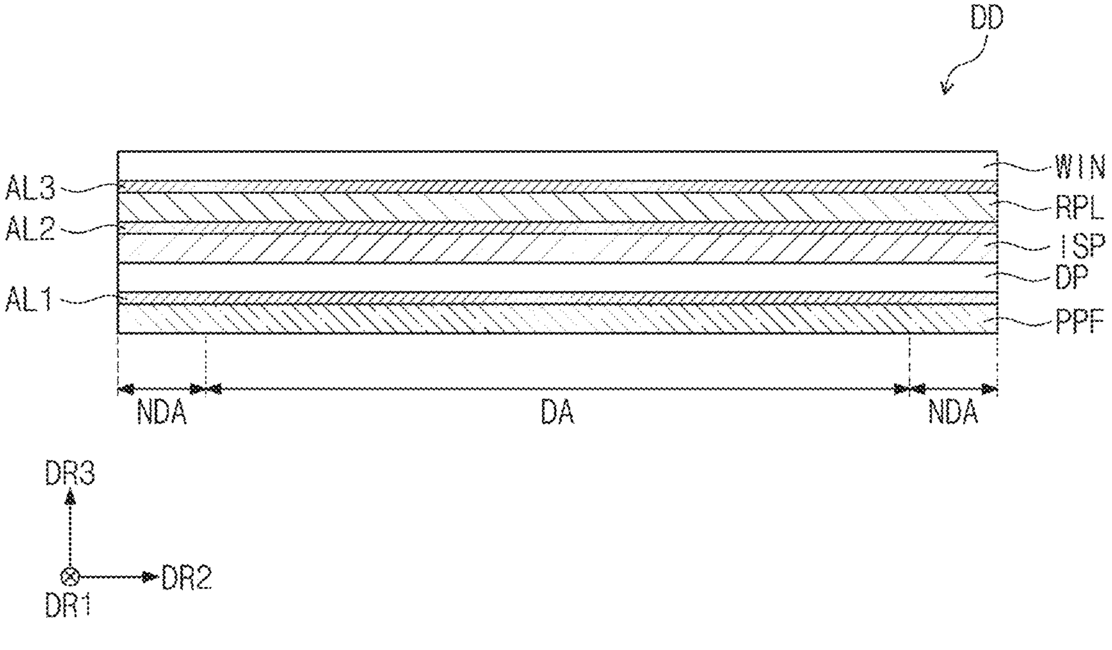
FIG. 2 is a cross-sectional view of a display device according to an embodiment of the present disclosure.

FIG. 2 is a cross-sectional view of a display device according to an embodiment of the present disclosure. FIG. 2 illustrates a cross-section of a display device DD when seen in the first direction DR1.

Referring to FIG. 2, the display device DD may include a display panel DP, an input-sensing part ISP, an anti-reflective layer RPL, a window WIN, a panel protective film PPF, and first to third adhesive layers AL1, AL2, and AL3.

The display panel DP may be a flexible display panel. The display panel DP according to an embodiment of the present disclosure may be a light-emitting display panel, but is not specially limited thereto. For example, the display panel DP may be an organic light-emitting display panel, or an inorganic light-emitting display panel. A light-emitting layer of the organic light-emitting display panel may include an organic light-emitting material. A light-emitting layer of the inorganic light-emitting display panel may include a quantum dot, and a quantum rod. Hereinafter, the display panel DP will be described as an organic light-emitting display panel.

The input-sensing part ISP may be on the display panel DP. The input-sensing part ISP may include a plurality of sensing portions for capacitively sensing external inputs. The input-sensing part ISP may be directly manufactured on the display panel DP in manufacture of a display device DD. For example, the input-sensing part ISP may be directly on the display panel DP. In some embodiments, in the present disclosure, "directly disposed" or "directly on" may refer to that there is no layer, film, region, plate, etc. added between a portion of a layer, film, region, plate, etc., and another portion. The input-sensing part ISP may be disposed to contact the upper surface of the display panel DP without utilizing an additional member such as a separate adhesive member, but an embodiment of the present disclosure is not limited thereto. The input-sensing part ISP may be manufactured as a panel separate from the display panel DP, and be bonded to the display panel DP by an adhesive layer.

The anti-reflective layer RPL may be on the input-sensing part ISP. The anti-reflective layer RPL may be defined as an external light anti-reflection film. The anti-reflective layer RPL may reduce the reflectance of external light incident from above the display device DD toward the display panel DP.

If external light propagating toward the display panel DP is reflected by the display panel DP and provided to external user again, the user may view the external light, like a mirror. To prevent or reduce this phenomenon, the anti-reflective layer RPL may include, for example, a plurality of color filters which display the same color as pixels of the display panel DP.

The color filters may filter external light with the same colors as those of the pixels. In this case, the external light may be invisible to a user. However, an embodiment of the present disclosure is not limited thereto, and the anti-reflective layer RPL may include a retarder and/or a polarizer to reduce the reflectance of external light.

The window WIN may be on the anti-reflective layer RPL. The window WIN may protect the display panel DP, the input-sensing part ISP, and the anti-reflective layer RPL from external scratch and impact.

The panel protective film PPF may be under the display panel DP. The panel protective film PPF may protect the lower portion of the display panel DP. The panel protective film PPF may include a flexible plastic material such as polyethyleneterephthalate (PET).

Figure 3:
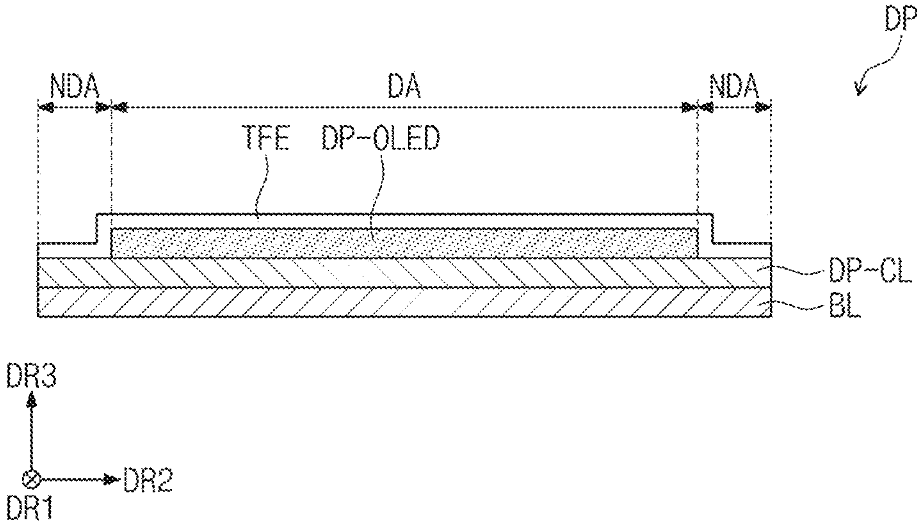
FIG. 3 is a cross-sectional view of a display panel according to an embodiment of the present disclosure.

The first adhesive layer AL1 may be between the display panel DP and the panel protective film PPF, and the display panel DP and the panel protective film PPF may be bonded to each other by the first adhesive layer AL1. The second adhesive layer AL2 may be between the anti-reflective layer RPL and the input-sensing part ISP, and the anti-reflective layer RPL and the input-sensing part ISP may be bonded to each other by the second adhesive layer AL2. The third adhesive layer AL3 may be between the window WIN and the anti-reflective layer RPL, and the window WIN and the anti-reflective layer RPL may be bonded to each other by the third adhesive layer AL3. FIG. 2 illustrates that the panel protective film PPF is bonded to the lower portion of the display panel DP by the first adhesive layer AL1, but an embodiment of the present disclosure is not limited thereto. The first adhesive layer AL1 may not be provided, and the panel protective film PPF may be directly under the display panel DP. FIG. 2 illustrates that the anti-reflective layer RPL is bonded to the upper portion of the input-sensing part ISP by the second adhesive layer AL2, but an embodiment of the present disclosure is not limited thereto. The second adhesive layer AL2 may not be provided, and the anti-reflective layer RPL may be directly on the input-sensing part ISP. FIG. 3 illustrates that the window WIN is bonded to the upper portion the anti-reflective layer RPL by the third adhesive layer AL3, but an embodiment of the present disclosure is not limited thereto. The third adhesive layer AL3 may not be provided, and the window WIN may be directly on the anti-reflective layer RPL.

Each of the first adhesive layer AL1 to the third adhesive layer AL3 may include an acrylic adhesive, a urethane-based adhesive, a silicone-based adhesive, an epoxy-based adhesive, a rubber-based adhesive, a vinyl ether-based adhesive, etc. Each of the first adhesive layer AL1 to the third adhesive layer AL3 may be a transparent adhesive member such as a pressure sensitive adhesive film (PSA), an optically clear adhesive film (OCA), and/or an optically clear resin (OCR).

FIG. 3 is a cross-section of a display panel according to an embodiment of the present disclosure. FIG. 3 illustrates a cross-section of a display panel DP when seen in the first direction DR1.

Referring to FIG. 3, the display panel DP may include a base layer BL, a circuit layer DP-CL on the base layer BL, a display element layer DP-OLED on the circuit layer DP-CL, and a thin-film encapsulation layer TFE on the display element layer DP-OLED.

The base layer BL may include a display region DA and a non-display region NDA around the display region DA. The base layer BL may be a flexible substrate, and may include any suitable material without limitation as long as the material is a flexible material which is rollable or foldable. For example, the base layer BL may include a flexible plastic material such as polyimide. In some embodiments, the base layer BL may include a flexible substrate such as a thin-film glass substrate and/or a thin-film metal substrate.

The display element layer DP-OLED may be on the display region DA. A plurality of pixels may be on the circuit layer DP-CL and the display element layer DP-OLED. The pixels may each include transistors on the circuit layer DP-CL, and a light-emitting element on the display element layer DP-OLED and connected to the transistors. The transistors may each include a semiconductor pattern including a source, an active (e.g., a channel or active layer), a drain, and a gate. The light-emitting element may include a first electrode, a light-emitting layer, a second electrode which are sequentially stacked, and the first electrode of the light-emitting element may be connected to the drain of the transistor through connection electrodes. A detailed configuration of a pixel will be described with reference to FIG. 5.

The thin-film encapsulation layer TFE may be on the circuit layer DP-CL to cover the display element layer DP-OLED. The thin-film encapsulation layer TFE may protect pixels from moisture, oxygen, and foreign matters. The thin-film encapsulation layer TFE may have a single-layer structure or multilayer structure. The thin-film encapsulation layer TFE may include a plurality of inorganic layers which are sequentially stacked, and at least one organic layer, but layers constituting the thin-film encapsulation layer TFE are not limited thereto. For example, the thin-film encapsulation layer TFE may include a structure in which an organic layer is between two inorganic layers. In some embodiments, the thin-film encapsulation layer TFE may include a structure in which a plurality of inorganic layers and a plurality of organic layers are alternately disposed.

Figure 4:
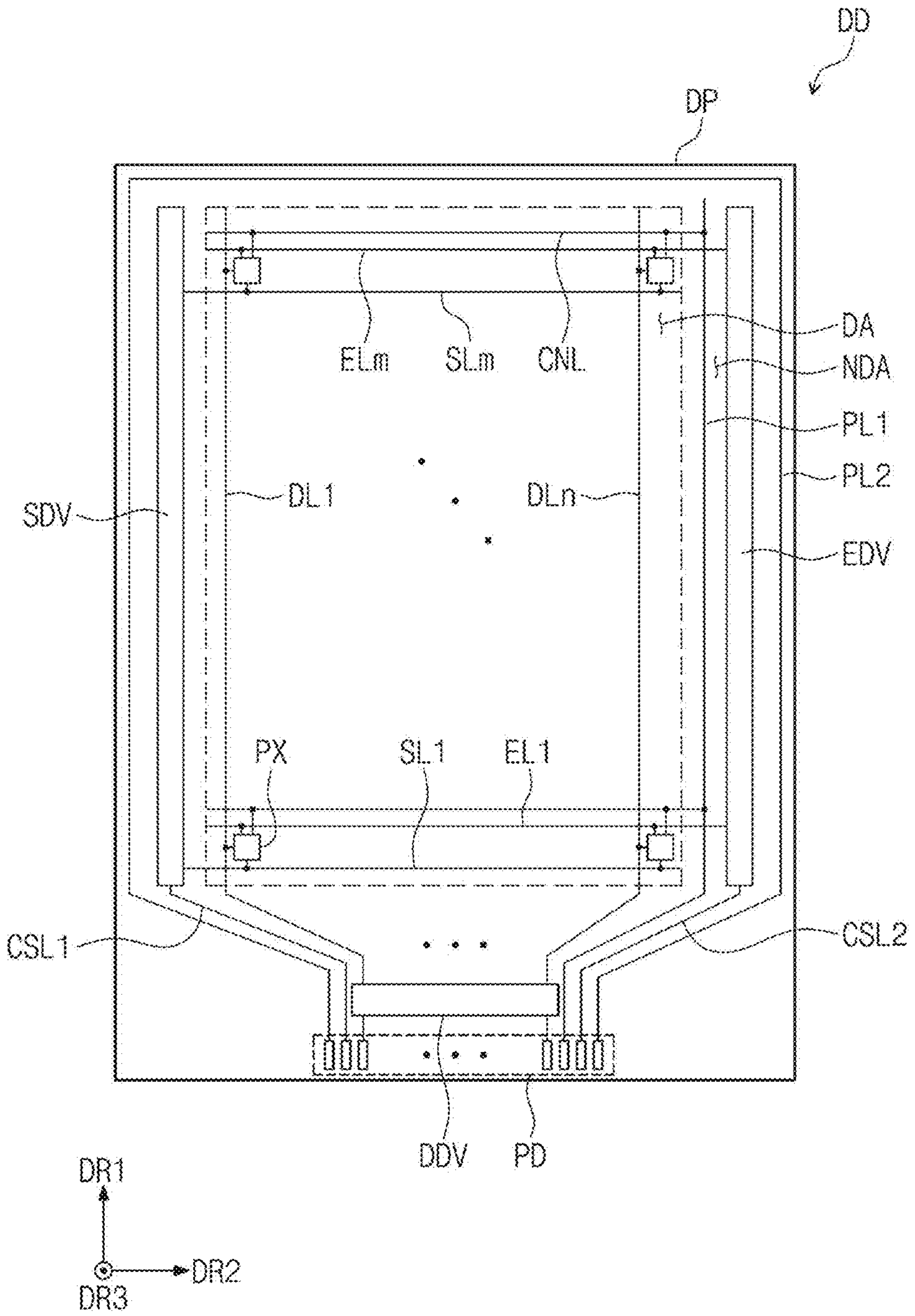
FIG. 4 is a plan view of a display panel according to an embodiment of the present disclosure.

FIG. 4 is a plan view of a display panel according to an embodiment of the present disclosure.

Referring to FIG. 4, a display device DD may include a display panel DP, a scanning driving portion SDV, a data driving portion DDV, a light-emitting driving portion EDV, and a plurality of pads PD.

The display panel DP may have a rectangular shape which has long sides extending in the first direction DR1, and short sides extending in the second direction DR2, but the shape of the display panel DP is not limited thereto. The display panel DP may include a display region DA, and a non-display region NDA around (e.g., surrounding) the display region DA.

The display panel DP may include a plurality of pixels PX, a plurality of scanning lines SL1 to SLm, a plurality of data lines DL1 to DLn, a plurality of light-emitting lines EL1 to ELm, first and second control lines CSL1 and CSL2, first and second power lines PL1 and PL2, and connecting lines CNL. m and n are each a natural number greater than 1.

The pixels PX may be in the display region DA. The scanning driving portion SDV and the light-emitting driving portion EDV may be in the non-display region NDA adjacent to each of the long sides of the display panel DP. The data driving portion DDV may be in the non-display region NDA adjacent to any one short side of the short sides of the display panel DP. When seen on a plane, the data driving portion DDV may be adjacent to the lower end of the display panel DP.

The scanning lines SL1 to SLm may extend in the second direction DR2, and be connected to the pixels PX, and the scanning driving portion SDV. The data lines DL1 to DLn may extend in the first direction DR1, and be connected to the pixels PX and the data driving portion DDV. The light-emitting lines EL1 to ELm may extend in the second direction DR2, and be connected to the pixels PX and the light-emitting driving portion EDV.

The first power line PL1 may extend in the first direction DR1, and be on the non-display region NDA. The first power line PL1 may be between the display region DA and the light-emitting driving portion EDV.

The connecting lines CNL may extend in the second direction DR2 and be arranged in the first direction DR1, thereby being connected to the first power line PL1 and the pixels PX. A first voltage may be applied to the pixels PX through the first power line PL1 and the connecting lines CNL which are connected to each other. The connecting lines CNL may be substantially defined as a part of the first power line PL1 that receives the first voltage.

The second power line PL2 may be in the non-display region NDA, and extend along the long sides of the display panel DP and along another short side, of the display panel DP, on which the data driving portion DDV is not disposed. The second power line PL2 may be on a portion outer than the scanning driving portion SDV and the light-emitting driving portion EDV.

In one or more embodiments, the second power line PL2 may extend to the display region DA, and be connected to the pixels PX. A second voltage having a lower level than that of the first voltage may be applied to the pixels PX through the second power line PL2.

The first control line CSL1 may be connected to the scanning driving portion SDV, and extend to the lower end of the display panel DP. The second control line CSL2 may be connected to the light-emitting driving portion EDV, and extend to the lower end of the display panel DP. The data driving portion DDV may be between the first control line CSL1 and the second control line CSL2.

The pads PD may be in the non-display region NDA adjacent to the lower end of the display panel DP, and may be more adjacent to the lower end of the display panel DP than the data driving portion DDV. The data driving portion DDV, the first and second power lines PL1 and PL2, and the first and second control lines CSL1 and CSL2 may be connected to the pads PD. The data lines DL1 to DLn may be connected to the data driving portion DDV, and the data driving portion DDV may be connected to the pads PD corresponding to the data lines DL1 to DLn.

In one or more embodiments, the display device DD may further include a timing controller for controlling the operations of the scanning driving portion SDV, the data driving portion DDV and the light-emitting driving portion EDV, and a voltage generation portion for generating the first and second voltages. The timing controller and the voltage generation portion may be connected to the corresponding pads PD through a printed circuit board.

The scanning driving portion SDV may generate a plurality of scanning signals, and the scanning signals may be applied to the pixels PX through the scanning lines SL1 to SLm. The data driving portion DDV may generate a plurality of data voltages, and the data voltages may be applied to the pixels PX through the data lines DL1 to DLn. The light-emitting driving portion EDV may generate a plurality of light emission signals, and the light emission signals may be applied to the pixels PX through the light-emitting lines EL1 to ELm.

The pixels PX may receive the data voltages in response to scanning signals. The pixels PX may display images by emitting light having a luminescence corresponding to the data voltages in response to the light emission signals.

Figure 5:
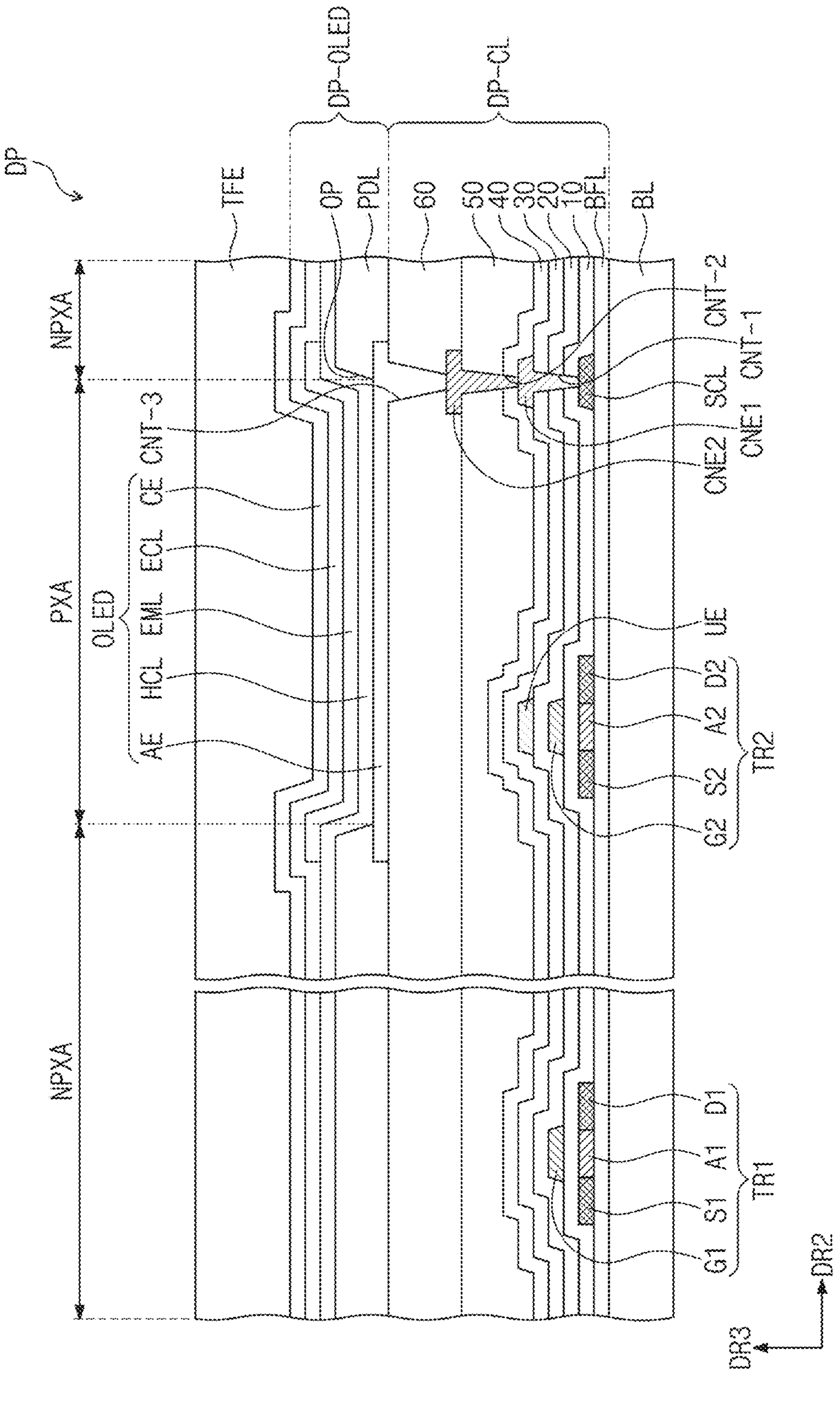
FIG. 5 is a cross-sectional view illustrating a pixel of a display panel according to an embodiment of the present disclosure.

FIG. 5 is a cross-section of a pixel of a display panel according to an embodiment of the present disclosure.

Referring to FIG. 5, a display panel DP may include a base layer BL, and a circuit layer DP-CL, a light-emitting element layer DP-ED, and an encapsulation layer TFE which are on the base layer BL.

The base layer BL may include a synthetic resin layer. The synthetic resin layer may include a thermosetting resin. For example, the synthetic resin layer may be a polyimide-based resin layer, and the material thereof is not specially limited. The synthetic resin layer may include at least one of an acrylic resin, a methacrylic resin, a polyisoprene-based resin, a vinyl-based resin, an epoxy-based resin, a urethane-based resin, a cellulose-based resin, a siloxane-based resin, a polyamide-based resin, or a perylene-based resin. In some embodiments, the base layer BL may include a glass substrate, a metal substrate, an organic/inorganic composite material substrate, and/or the like.

At least one inorganic layer is on the upper surface of the base layer BL. The inorganic layer may include at least one of aluminum oxide, titanium oxide, silicon oxide, silicon oxynitride, zirconium oxide, or hafnium oxide. The inorganic layer may be formed in a multilayer form. The multilayered inorganic layers may constitute a barrier layer BRL, and/or a buffer layer BFL to be described later. The barrier layer BRL and the buffer layer BFL may be selectively disposed.

The barrier layer BRL prevents or reduces foreign matters from being introduced from the outside. The barrier layer BRL may include a silicon oxide layer and a silicon nitride layer. Each of the barrier layers BRL may be provided in plurality, and silicon oxide layers and silicon nitride layers may be alternately stacked.

The buffer layer BFL may be on the barrier layer BRL. The buffer layer BFL increases bonding force between the base layer BL, and a semiconductor pattern and/or a conductive pattern. The buffer layer BFL may include a silicon oxide layer and/or a silicon nitride layer. Silicon oxide layers and silicon nitride layers may be alternately stacked.

A semiconductor pattern is on the buffer layer BFL. The semiconductor pattern may include a silicon semiconductor. The semiconductor pattern may include polysilicon. However, an embodiment of the present disclosure is not limited thereto, and the semiconductor pattern may include amorphous silicon.

FIG. 5 illustrates a part of a semiconductor pattern, and a semiconductor pattern may be additionally in another region of a pixel PX (see FIG. 4). The semiconductor pattern has different electrical properties according to whether the semiconductor pattern is doped or not. The semiconductor pattern may include a doped region and/or an undoped region. The doped region may be doped with an n-type or kind dopant, or a p-type or kind dopant. A p-type or kind transistor includes a doped region doped with a p-type or kind dopant, and an n-type or kind transistor includes a doped region doped with an n-type or kind dopant.

The doped region is more conductive than the undoped region, and substantially serves as an electrode or a signal line. The undoped region substantially servers as an active (or channel) of a transistor. For example, a part of a semiconductor pattern may be an active (or channel) of a transistor, and another part may be a source or a drain of a transistor, and another part may be a connection signal line (or connecting electrode).

As illustrated in FIG. 5, a first electrode S1, a channel portion A1, and a second electrode D1 of a first transistor TR1 are formed from a semiconductor pattern, and a first electrode S2, a channel portion A2, and a second electrode D2 of a second transistor TR2 are formed from a semiconductor pattern. The first electrode S1 and the second electrode D1 of the first transistor TR1 extend in opposite directions from the channel portion A1, and the first electrode S2 and the second electrode D2 of the second transistor TR2 extend in opposite directions from the channel portion A2. FIG. 5 illustrates a part of a connection signal line SCL formed of semiconductor patterns. Although not separately illustrated, the connection signal line SCL may connected to a second electrode of another transistor on a plane.

The circuit layer DP-CL may include at least one organic insulating layer on the base layer BL. The circuit layer DP-CL may include first to sixth insulating layers 10, 20, 30, 40, 50, and 60, at least one of the first to sixth insulating layers 10, 20, 30, 40, 50, or 60 included in the circuit layer DP-CL may be an organic insulating layer. For example, a fifth insulating layer 50 and a sixth insulating layer 60 included in the circuit layer DP-CL may be an organic insulating layer. When the circuit layer DP-CL includes at least one organic insulating layer, the organic insulating layer may be formed of a photosensitive resin composition according to an embodiment of the present disclosure to be described later. A detailed description of the photosensitive resin composition will be presented herein below.

The first insulating layer 10 is on the buffer layer BFL. The first insulating layer 10 overlaps a plurality of pixels PX (see FIG. 4) (e.g., in common), and covers a first semiconductor pattern. The first insulating layer 10 may be an inorganic layer and/or an organic layer, and have a single-layer structure or multilayer structure. The first insulating layer 10 may include at least one of aluminum oxide, titanium oxide, silicon oxide, silicon oxynitride, zirconium oxide, or hafnium oxide. In the present embodiment, the first insulating layer 10 may be a single-layered silicon oxide layer. An insulating layer of the circuit layer DP-CL to be described later, as well as the first insulating layer 10 may each be an inorganic layer and/or an organic layer, and have a single-layer structure or multilayer structure. The inorganic layer may include at least one of the aforementioned materials.

The third electrode G1 of the first transistor TR1 and the third electrode G2 of the second transistor TR2 are on the first insulating layer 10. The third electrodes G1 and G2 may be a part of a metal pattern. The third electrode G1 of the first transistor TR1 overlaps the channel portion A1 of the first transistor TR1, and the third electrode G2 of the second transistor TR2 overlaps the channel portion A2 of the second transistor TR2. In a process of doping a semiconductor pattern, the third electrodes G1 and G2 of the first and second transistors TR1 and TR2 may serve as a mask.

The second insulating layer 20 which covers the third electrodes G1 and G2 is on the first insulating layer 10. The second insulating layer 20 overlaps a plurality of pixels PX (see FIG. 4) (e.g., in common). The second insulating layer 20 may be an inorganic layer and/or an organic layer, and have a single-layer structure or multilayer structure. In the present embodiment, the second insulating layer 20 may be a single-layered silicon oxide layer.

An upper electrode UE may be on the second insulating layer 20. The upper electrode UE may overlap the third electrode G2 of the second transistor TR2. The upper electrode UE may be a part of a metal pattern, or a part of a doped semiconductor pattern. A part of the third electrode G2 and the upper electrode UE overlapping the same may define a capacitor. In an embodiment of the present disclosure, the upper electrode UE may not be provided.

In an embodiment of the present disclosure, the second insulating layer 20 may be substituted with an insulating pattern. The upper electrode UE is on the insulating pattern. The upper electrode UE may serve as a mask which forms an insulating pattern from the second insulating layer 20.

The third insulating layer 30 covering the upper electrode UE is on the second insulating layer 20. In the present embodiment, the third insulating layer 30 may be a single-layered silicon oxide layer. A first connecting electrode CNE1 may be on the third insulating layer 30. The first connecting electrode CNE1 may be connected to a connection signal line SCL through a contact hole CNT-1 penetrating the first to third insulating layers 10 to 30

The fourth insulating layer 40 may be on the third insulating layer 30. In the present embodiment, the fourth insulating layer 40 may be a single-layered silicon oxide layer. The fifth insulating layer 50 may be on the fourth insulating layer 40. The fifth insulating layer 50 may be an organic insulating layer. A second connecting electrode CNE2 may be on the fifth insulating layer 50. The second connecting electrode CNE2 may be connected to the first connecting electrode CNE1 through a contact hole CNT-2 penetrating the fourth insulating layer 40 and the fifth insulating layer 50.

The sixth insulating layer 60 may be on the fifth insulating layer 50, and cover the second connecting electrode CNE2. The sixth insulating layer 60 may be an organic insulating layer. A first electrode AE is on the sixth insulating layer 60. The first electrode AE is connected to the second connecting electrode CNE2 through a contact hole CNT-3 penetrating the sixth insulating layer 60. An opening OP is defined in a pixel-defining film PDL. The opening OP of the pixel-defining film PDL exposes at least a part of the first electrode AE.

A display region DA of the display panel DP (see FIG. 4) may include a light-emitting region PXA and a non light-emitting region NPXA adjacent to the light-emitting region PXA. The non light-emitting region NPXA may be adjacent to the light-emitting region PXA, and surround the light-emitting region PXA. In the present embodiment, the light-emitting region PXA is defined to correspond to a part of the first electrode AE exposed by the opening OP.

The display element layer DP-OLED includes a light-emitting element OLED and the pixel-defining film PDL. The first electrode AE of the light-emitting element OLED is on the sixth insulating layer 60. The first electrode AE of the light-emitting element OLED may be connected to the second connecting electrode CNE2 through the contact hole CNT-3 penetrating the sixth insulating layer 60.

The opening OP of the pixel-defining film PDL exposes at least a part of the first electrode AE of the light-emitting element OLED. The opening OP of the pixel-defining film PDL may define the light-emitting region PXA. For example, a plurality of pixels PX (see FIG. 4) may be on a plane (e.g., in a plan view) according to a set of predetermined rules or patterns. A region in which the plurality of pixels PX (see FIG. 4) are may be defined as a pixel region, and one pixel region may include a light-emitting region PXA and a non light-emitting region NPXA adjacent to the light-emitting region PXA. The non light-emitting region NPXA may surround the light-emitting region PXA. The pixel-defining film PDL may be formed of a photosensitive resin composition according to an embodiment of the present disclosure to be described later.

Referring to FIG. 5, a hole control layer HCL may be on the light-emitting region PXA and the non light-emitting region NPXA (e.g., in common). A common layer such as the hole control layer HCL may be formed on the plurality of pixels PX (e.g., in common). The hole control layer HCL may include a hole transport layer and a hole injection layer.

A light-emitting layer EML is on the hole control layer HCL. The light-emitting layer EML may be only in a region corresponding to the opening OP. The light-emitting layer EML may be separately formed in each of the plurality of pixels PX (see FIG. 4).

In the present embodiment, a patterned light-emitting layer EML is illustrated. The light-emitting layer EML may be on the plurality of pixels PX (see FIG. 4). In this case, the light-emitting layer EML may generate white light or blue light. In some embodiments, the light-emitting layer EML may have a multilayer structure.

An electron control layer ECL is on the light-emitting layer EML. The electron control layer ECL may include an electron transport layer and an electron injection layer. The second electrode CE of the light-emitting element ED is on the electron control layer ECL. The electron control layer ECL and the second electrode CE are on the plurality of pixels PX.

The encapsulation layer TFE is on the second electrode CE. The encapsulation layer TFE may cover the plurality of pixels PX (see FIG. 4). In present embodiment, the encapsulation layer TFE directly covers the second electrode CE. In an embodiment of the present disclosure, the display panel DP may further include a capping layer which directly covers the second electrode CE. In an embodiment of the present disclosure, the stacking structure of the light-emitting element ED may have a structure in which the structure illustrated in FIG. 5 is vertically inverted.

Hereinafter, description about a photosensitive resin composition according to an embodiment of the present disclosure will be made in more detail. The photosensitive resin composition according to an embodiment may be utilized for manufacturing an organic insulating layer and/or a pixel-defining film. For example, the photosensitive resin composition according to an embodiment may be utilized to form at least one of the fifth insulating layer 50 or the sixth insulating layer 60 which are organic insulating layers included in the circuit layer DP-CL. The photosensitive resin composition according to an embodiment may be utilized for the process of forming at least one of the pixel-defining films PDL included in the display element layer DP-OLED.

The photosensitive resin composition according to an embodiment of the present disclosure may include a silsesquioxane-based copolymer obtained by copolymerizing a first monomer, a second monomer, a third monomer, and a fourth monomer which are different from each other.

In the present disclosure, "substituted or unsubstituted" may refer to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents which are exemplified above may be substituted or unsubstituted. For example, a biphenyl group may be an aryl group, and may be also a phenyl group substituted with a phenyl group.

In the present disclosure, the alkyl group may have a straight chain or a branched chain. The number of carbon atoms of the alkyl group is one to fifty, one to thirty, one to twenty, one to ten, or one to six. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, an 1-methylpentyl group, a 3-methylpentyl group, a 2-ethylpentyl group, a 4-methyl-2-pentyl group, an n-hexyl group, an 1-methylhexyl group, a 2-ethylhexyl group, a 2-butylhexyl group, an n-heptyl group, an 1-methylheptyl group, a 2,2-dimethylheptyl group, a 2-ethylheptyl group, a 2-butylheptyl group, an n-oxtyl group, a t-octyl group, a 2-ethyloctyl group, a 2-butyloctyl group, a 2-hexyloctyl group, a 3,7-dimethyloctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-icosyl group, a 2-ethylicosyl group, a 2-butylicosyl group, a 2-hexylicosyl group, a 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but an embodiment of the present disclosure is not limited thereto.

In the present disclosure, the aryl group refers to an arbitrary functional group or substituent which is derived from an aromatic hydrocarbon ring. The aryl group may be a monocyclic aryl group, or a polycyclic aryl group. The number of ring-forming carbon atoms of the aryl group may be six to thirty, six to twenty, or six to fifteen. Examples of the aryl group include (e.g., are) a phenyl group, a naphthyl group, a fluorenyl group, an anthracenyl group, a phenanthryl group, a biphenyl group, a terphenyl group, a quarterphenyl group, a quinquephenyl group, a sexyphenyl group, a triphenylenyl group, a pyrenyl group, a benzofluoranthenyl group, a crisenyl group, etc., but an embodiment of the present disclosure is not limited thereto.

In the present disclosure, the above descriptions of the aryl group and the heteroaryl group may be similarly applied to the arylene group and the heteroarylene group, respectively, noting that both the arylene group and the heteroarylene group are divalent.

In the present disclosure, the alkoxy group may have a straight chain, a branched chain, or a cyclic chain. The number of carbon atoms of the alkoxy group is not limited, and may be, for example, one to twenty, or one to ten. Examples of the alkoxy group may include a methoxy group, an ethoxy group, an n-propoxy group, an isopropoxy group, a butoxy group, a pentyloxy group, a hexyloxy group, an octyloxy group, a nonyloxy group, a decyloxy group, etc., but an embodiment of the present disclosure is not limited thereto.

In the present disclosure, a direct linkage may refer to a single bond.

In an embodiment, a first monomer may be represented by Chemical Formula 1. The first monomer may include at least one hydrophilic group. For example, the first monomer may include, as a substituent, at least one of a mercapto group or a furanyl group. The mercapto group and the furanyl group may each be directly bonded to a silicon atom of the first monomer, or bonded to a silicon atom of the first monomer via a linker. The first monomer including this substituent may be included in the backbone of a silsesquioxane-based copolymer to contribute to easy control of solubility in alkali.

$R_1—R_2—Si(R_3)_3$ Chemical Formula 1

In Chemical Formula 1, $R_1$ is a substituted or unsubstituted mercapto group, or a substituted or unsubstituted furanyl group. For example, $R_1$ may be an unsubstituted mercapto group, or an unsubstituted furanyl group.

In Chemical Formula 1, $R_2$ is a direct linkage, or a substituted or unsubstituted divalent alkyl group having three to six carbon atoms. For example, $R_2$ may be a direct linkage, or divalent propyl group.

In Chemical Formula 1, $R_3$ is a substituted or unsubstituted alkoxy group one to three carbon atoms. For example, $R_3$ may be a substituted or unsubstituted methoxy group.

In an embodiment, the first monomer represented by Chemical Formula 1 may include at least one of 3-(mercapto)propyltrimethoxysilane or trimethoxy(2-furanyl)silane.

Because the first monomer constituting a silsesquioxane-based copolymer according to an embodiment includes at least one substituent of a mercapto group or a furanyl group, solubility in alkali may be controlled or selected, and high sensitivity to an alkaline developer may be ensured when utilized in a photosensitive resin composition according to an embodiment.

In an embodiment, at least one type or kind of the first monomer represented by Chemical Formula 1 may be utilized. For example, when a silsesquioxane-based copolymer is formed, two different types (kinds) of the first monomers may be utilized. The first monomer represented by Chemical Formula 1 may include a (1-1)-st monomer represented by Chemical Formula 1-1, and a (1-2)-nd monomer represented by Chemical Formula 1-2. The two different types (kinds) of the first monomers may each include, as a substituent, a mercapto group and a furanyl group. When two different types (kinds) of the first monomers are utilized, the silsesquioxane-based copolymer according to an embodiment may be obtained by copolymerizing two different types (kinds) of the first monomers, and the second to fourth monomers to be described later. The silsesquioxane-based copolymer according to an embodiment may be obtained by copolymerizing the (1-1)-st monomer, the (1-2)-nd monomer, and the second to fourth monomers will be described below. In this embodiment, the second to fourth monomers may be utilized alone, or in combination of two or more.

$R_{1-1}—R_2—Si(R_3)_3$ Chemical Formula 1-1

$R_{1-2}—R_2—Si(R_3)_3$ Chemical Formula 1-2

In Chemical Formula 1-1 and Chemical Formula 1-2, $R_{1-1}$ is a substituted or unsubstituted mercapto group, and $R_{1-2}$ is a substituted or unsubstituted furanyl group.

In some embodiments, in Chemical Formula 1-1 and Chemical Formula 1-2, the same groups as defined in Chemical Formula 1 may be applied to $R_2$ and $R_3$.

In an embodiment, the second monomer may be represented by Chemical Formula 2. The second monomer may include at least one hydrophobic substituent. The hydrophobic substituent may be directly bonded to a silicon atom of the second monomer. In Chemical Formula 2, a hydrophobic substituent may be $R_4$. Similar to the aforementioned first monomer, the second monomer with or without the aforementioned substituent may be included in the backbone of a silsesquioxane-based copolymer to contribute to easy control of alkali development characteristics.

$(R_4)_n—Si(R_5)_{4-n}$ Chemical Formula 2

In Chemical Formula 2, $R_4$ is a substituted or unsubstituted alkyl group having one to three carbon atoms, or a substituted or unsubstituted aryl group having six to twelve ring-forming carbon atoms. For example, $R_4$ may be a substituted or unsubstituted methyl group, a substituted or unsubstituted ethyl group, a substituted or unsubstituted propyl group, or a substituted or unsubstituted phenyl group.

In Chemical Formula 2, $R_5$ is a substituted or unsubstituted alkoxy group having one to three carbon atoms. For example, $R_5$ may be a substituted or unsubstituted methoxy group, or a substituted or unsubstituted ethoxy group.

In Chemical Formula 2, n is an integer of 1-3. If n is an integer of 2 or more, a plurality of $R_5$ may each independently be the same as or different from each other. When n is 1, the second monomer represented by Chemical Formula 2 may be a trifunctional alkoxysilane compound. When n is 2, the second monomer represented by Chemical Formula 2 may be a bifunctional alkoxysilane compound. When n is 3, the monomer represented by Chemical Formula 2 may be a monofunctional alkoxysilane compound.

Examples of the second monomer represented by Chemical Formula 2 may include: a trifunctional alkoxysilane compound such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, p-hydroxyphenyltrimethoxysilane, 1-naphthyltrimethoxysilane, 1-naphthyltriethoxysilane, 1-naphthyltri-n-propoxysilane, 2-naphthyltrimethoxysilane, 9-fluorenyltrimethoxysilane, 2-fluorenyltrimethoxysilane, and 2-indenyltrimethoxysilane; a bifunctional alkoxysilane compound such as dimethyldimethoxysilane, dimethyldiethoxysilane, dimethyldiacetoxysilane, di-n-butyldimethoxysilane, diphenyldimethoxysilane, di(1-naphthyl)dimethoxysilane, and di(1-naphthyl)diethoxysilane; and a monofunctional alkoxysilane compound such as trimethylmethoxysilane and/or tri-n-butylethoxysilane.

In an embodiment, the second monomer may include at least one of methyltrimethoxysilane, propyltrimethoxysilane, phenyltrimethoxysilane, diphenyldimethoxysilane, or diphenyldiethoxysilane.

In an embodiment, the second monomer represented by Chemical Formula 2 may be represented by Chemical Formula 2-1 or Chemical Formula 2-2.

$R_4—Si(R_5)_3$ Chemical Formula 2-1

$(R_4)_2—Si(R_5)_2$ Chemical Formula 2-2

Chemical Formula 2-1 and Chemical Formula 2-2 each are a case in which n is specified in Chemical Formula 2.

Chemical Formula 2-1 is a case in which n is 1 in Chemical Formula 2. Chemical Formula 2-2 is a case in which n is 2 in Chemical Formula 2.

In some embodiments, in Chemical Formula 2-1 and Chemical Formula 2-2, the same contents defined in Chemical Formula 2 may be applied to $R_4$ and $R_5$.

In an embodiment, at least one type or kind of the second monomer represented by Chemical Formula 2 may be utilized. For example, two different types (kinds) of the second monomers represented by Chemical Formula 2 may be utilized, and the two different types (kinds) of the second monomers may be a compound represented by Chemical Formula 2-1, and a compound represented by Chemical Formula 2-2. For example, the two different types (kinds) of the second monomers may be each a bifunctional alkoxysilane compound, and a trifunctional alkoxysilane compound. When the two different types (kinds) of the second monomers are utilized, it is possible not only to easily control alkali development characteristics, but also to increase the heat resistance and chemical resistance of a cured film by improving reactivity during synthesis of a silsesquioxane-based copolymer.

In an embodiment, in addition to the first monomer represented by Chemical Formula 1, and the second monomer represented by Chemical Formula 2, an organosilane compound having a symmetric structure may be utilized to achieve molecular weight control and heat resistance characteristics. The organosilane compound having a symmetric structure may be a third monomer represented by Chemical Formula 3, and a fourth monomer represented by Chemical Formula 4. When the third monomer and the fourth monomer having these structures are included in the backbone of the silsesquioxane-based copolymer, the molecular weight of the silsesquioxane-based copolymer may be easily controlled or selected, and high heat resistance characteristics of a thin film may be obtained.

In an embodiment, the third monomer may be represented by Chemical Formula 3. The third monomer constituting a silsesquioxane-based copolymer may be a tetrafunctional alkoxysilane compound having a structure which is symmetric with respect to one silicon atom.

$Si(R_6)_4$ Chemical Formula 3

In Chemical Formula 3, $R_6$ may be a substituted or unsubstituted alkoxy group having one to three carbon atoms. For example, $R_6$ may be a substituted or unsubstituted methoxy group, a substituted or unsubstituted ethoxy group, or a substituted or unsubstituted propoxy group.

In an embodiment, the third monomer represented by Chemical Formula 3 may include at least one of tetramethoxysilane, tetraethoxysilane, or tetrapropoxysilane.

In an embodiment, the fourth monomer may be represented by Chemical Formula 4. The fourth monomer constituting a silsesquioxane-based copolymer may be a bissilane compound having a symmetric structure. The fourth monomer represented by Chemical Formula 4 may have a structure in which two silane groups are connected via a linker, or a structure which is symmetric with respect to a linker.

$(R_7)_3—Si—R_8—Si—(R_7)_3$ Chemical Formula 4

In Chemical Formula 4, $R_7$ is a substituted or unsubstituted alkoxy group having one to three carbon atoms. For example, $R_7$ may be a substituted or unsubstituted ethoxy group.

In Chemical Formula 4, $R_8$ is a substituted or unsubstituted arylene group having six to twelve ring-forming carbon atoms. For example, $R_8$ may be a substituted or unsubstituted divalent phenyl group, or a substituted or unsubstituted divalent biphenyl group.

In an embodiment, the fourth monomer represented by Chemical Formula 4 may include at least one of 1,4-bis(triethoxysilyl)benzene, 1,3-bis(triethoxysilyl)benzene, or 4,4-bis(triethoxysilyl)-1,1'-biphenyl.

In an embodiment, with respect to the total content (e.g., amount) of the first to fourth monomers, the content (e.g., amount) of the first monomer may be about 5% to about 25% by weight, the content (e.g., amount) of the second monomer may be about 20% to about 60% by weight, the content (e.g., amount) of the third monomer may be about 20% to about 40% by weight, and the content (e.g., amount) of the fourth monomer may be about 5% to about 25% by weight. When the contents of the first to fourth monomers satisfy the aforementioned range, alkali solubility characteristics may improve, and heat resistance and chemical resistance of a thin film may be increased.

The silsesquioxane-based copolymer utilized in an embodiment of the present disclosure may be produced by copolymerizing the first monomer, the second monomer, the third monomer, and the fourth monomer through a sol-gel reaction. For example, the silsesquioxane-based copolymer is produced by copolymerizing the first monomer represented by Chemical Formula 1, the second monomer represented by Chemical Formula 2, the third monomer represented by Chemical Formula 3, and the fourth monomer represented by Chemical Formula 4 through a sol-gel reaction, and the arrangement order of the first to fourth monomers in each polymerization unit is not limited. For example, in an embodiment, the silsesquioxane-based copolymer may be produced by combining the first monomer, the second monomer, the third monomer, and the fourth monomer in a random combination order. When a silsesquioxane-based copolymer having a random structure is utilized for the photosensitive resin composition according to an embodiment, the heat resistance and chemical resistance characteristics thereof may be improved more than an embodiment utilizing a silsesquioxane-based copolymer having a cage or ladder structure. In some embodiments, synthesis of a silsesquioxane-based copolymer having a random structure may be economically advantageous because the process is simpler than that of a silsesquioxane-based copolymer having a cage or ladder structure.

In an embodiment, a silsesquioxane-based copolymer may include at least one repeating unit derived from the first monomer, the second monomer, the third monomer, and the fourth monomer. For example, the silsesquioxane-based copolymer according to an embodiment may be a copolymer including a repeating unit represented by Chemical Formula 5, but an embodiment of the present disclosure is not limited thereto.

Chemical Formula 5

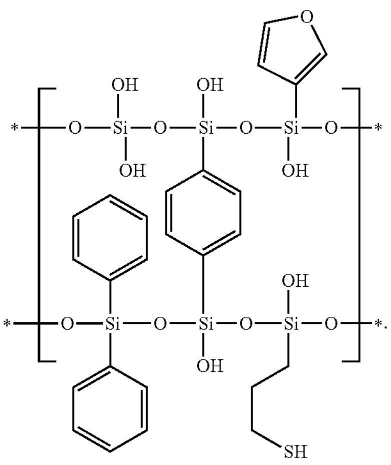

As in Chemical Formula 5, the silsesquioxane-based copolymer included in the photosensitive resin compound according to an embodiment may have a structure including at least one hydrophilic substituent, and at least one hydrophobic substituent. For example, the silsesquioxane-based copolymer included in the photosensitive resin composition according to an embodiment may be formed from a composition including the first monomer including at least one of a mercapto group or a furanyl group, and the second monomer including a hydrophobic substituent such as an alkyl group, or an aryl group. When the silsesquioxane-based copolymer having such a structure is utilized for a photosensitive resin composition, high-sensitivity and high-resolution patterns may be achieved by improving alkaline development characteristics, and excellent or suitable thin film stability may be obtained by suppressing (reducing) formation of residues after a process. In some embodiments, the molecular weight of the silsesquioxane-based copolymer may be easily controlled or selected by introducing the third monomer and the fourth monomer having a symmetric structure, thereby improving the heat resistance and chemical resistance of a thin film.

In an embodiment, the weight average molecular weight (Mw) of the silsesquioxane-based copolymer may be about 5000 to about 15000. When the weight average molecular weight of the silsesquioxane-based copolymer included in the photosensitive resin composition according to an embodiment satisfies the aforementioned range, sensitivity may be increased by improving solubility characteristics in an exposed portion, and thin film stability may be improved by suppressing (reducing) scum after development. The weight average molecular weight of the silsesquioxane-based copolymer may be properly (suitably) controlled or selected by controlling the types (kinds) and contents of the first to fourth monomers.

In an embodiment, the dispersity of the silsesquioxane-based copolymer may be about 2.0 to about 4.0. When the dispersity of the silsesquioxane-based copolymer satisfies the aforementioned range, the heat resistance and chemical resistance of a thin film may be improved, and the development speed of a photosensitive resin composition is suitably controlled or selected, thereby increasing a residual film rate. In some embodiments, the dispersity in the present disclosure may refer to a ratio of a weight average molecular weight (Mw) to a number average molecular weight (Mn).

The content (e.g., amount) of the silsesquioxane-based copolymer included in the photosensitive resin composition may be appropriately (suitably) controlled or selected according to the type or kind of a monomer being utilized and a process condition. The content (e.g., amount) of the silsesquioxane-based copolymer may be about 10% to about 40% by weight with respect to the total weight of the photosensitive resin composition. When the content (e.g., amount) of the silsesquioxane-based copolymer satisfies the aforementioned range, the sufficient (desired) thickness of a coated film may be obtained, and the heat resistance, chemical resistance, and transparency of a thin film may be further improved while maintaining the high-sensitivity and resolution characteristics of the photosensitive resin composition. When the content (e.g., amount) of the silsesquioxane-based copolymer is less than about 10% by weight, it is difficult to achieve the desired or suitable thickness of a coated film due to low viscosity. When the content (e.g., amount) of the silsesquioxane-based copolymer is greater than about 40% by weight, alkaline development characteristics may be reduced.

A photosensitive resin composition according to an embodiment of the present disclosure may be a positive photosensitive resin composition. In the present disclosure, the positive photosensitive resin composition is referred to as a composition with which the solubility of an exposed portion in alkaline developer is increased, and the exposed portion is removed by development, thereby forming a pattern. When the photosensitive resin composition according to an embodiment is a positive photosensitive resin composition, a photosensitive compound, which increases solubility of an exposed portion during development, may be utilized. In an embodiment, the photosensitive resin composition may further include a quinonediazide-based photosensitive compound as a photosensitive compound.

In an embodiment, the quinonediazide-based photosensitive compound may include at least one of 1,4-benzenediol, 1,2-benzenediol, 4,4'-dihydroxy-biphenyl, bisphenol-A, α,α-bis(4-hydroxyphenyl)-4-(4-hydroxy-α,α-dimethylbenzyl)-ethylbenzene, or a 4,4',4"-trihydroxyphenylmethane which includes, as a substituent, a naphthoquinone-1,2-diazide-4-sulfonic acid ester group or a naphthoquinone-1,2-diazide-5-sulfonic acid ester group.

When the photosensitive resin composition further includes a quinonediazide-based photosensitive compound, the quinonediazide-based photosensitive compound may be included in an amount of about 5% to about 20% by weight with respect to the total photosensitive resin composition. When the quinonediazide-based photosensitive compound is less than about 5% by weight, the effect of reducing solubility in an alkaline developer is lowered, which makes it difficult to achieve high-sensitivity characteristics. When the quinonediazide-based photosensitive compound is greater than about 20% by weight, the heat resistance and transparency of a thin film may be lowered due to decomposition of the quinonediazide-based photosensitive compound during curing, and a substantially uniform thin film may not be obtained due to occurrence of phase separation between a silsesquioxane-based copolymer and the quinonediazide-based photosensitive compound. When the content (e.g., amount) of the quinonediazide-based photosensitive compound satisfies the aforementioned range, development characteristics for an alkaline solution may be optimized, thereby achieving high sensitivity characteristics, and obtaining the heat resistance and transparency of a thin film.

In an embodiment, the photosensitive resin composition may further include a surfactant. The surfactant may be utilized to increase coating and development properties of the photosensitive resin composition. A silicone-based surfactant may be utilized as the surfactant. The content (e.g., amount) of the surfactant may be utilized in an amount of about 0.0001 parts by weight to about 2 parts by weight with respect to 100 parts by weight of the solid content (e.g., amount), but an embodiment of the present disclosure is not limited thereto.

In an embodiment, the photosensitive resin composition may further include a glycol-based solvent.

The glycol-based solvent may include at least one of butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

When the photosensitive resin composition according to an embodiment further includes the glycol-based solvent, the glycol-based solvent may be included in an amount of about 40% to about 85% by weight with respect to the total photosensitive resin composition. When the content (e.g., amount) of the glycol-based solvent satisfies the aforementioned range, the solubility of the silsesquioxane-based copolymer and the quinonediazide-based photosensitive compound increases, thereby increasing the transparency of a thin film. The glycol-based solvent may be appropriately controlled or selected according to the type or kind and content (e.g., amount) of each component included in the photosensitive resin composition, the desired or suitable viscosity of the composition and the desired or suitable thickness of a thin film, and/or the like.

Hereinafter, while referring to the Examples and Comparative Example, description of a photosensitive resin composition according to an embodiment of the present disclosure, and an organic insulating layer and a pixel-defining film utilizing the photosensitive resin composition will be presented in more detail. The Examples are intended to help with understanding the present disclosure, and the scope of the present disclosure is not limited thereto.

EXAMPLE

1. Production of Photosensitive Resin Composition

1) Example 1

(Operation A) (Preparation of Silsesquioxane-Based Copolymer)

3-(mercapto)propyltriethoxysilane (19.64 g, 0.10 mol), diphenyldimethoxysilane (73.31 g, 0.30 mol), methyltrimethoxysilane (27.24 g, 0.20 mol), tetramethoxysilane (45.67 g, 0.30 mol), 1,4-bis(triethoxysilane)benzene (40.26 g, 0.10 mol), propyleneglycolmonomethyletheracetate (200 g) were mixed in a 2 L flask equipped with a funnel, a cooling tube and a stirrer, and then the resultant solution was added with 20 g of 0.5 normal HCl aqueous solution as an acid catalyst while being stirred.

A reaction temperature was increased to 70° C., and stirring was performed for 18 hours. After finishing the reaction, distilled water was added and an organic phase was recovered through phase separation, thereby preparing 20 g of a silsesquioxane-based copolymer. A result of a gel permeation chromatography (GPC) measurement demonstrated that the weight average molecular weight of the silsesquioxane-based copolymer was 8000.

(Operation B) (Production of Photosensitive Resin Composition)

In a state in which ultraviolet light was blocked, (a) 100 parts by weight of the silsesquioxane-based copolymer prepared in the operation A of Example 1 in terms of a solid content (e.g., amount) ratio, (b) 20 parts by weight of 4,4',4"-trihydroxyphenylmethane 1,2-naphthoquinonediazide-5-sulfonate as a photosensitive compound, and 0.5 parts by weight of a silicone-based surfactant were dissolved and diluted in (c) propyleneglycolmonomethyletheracetate as a solvent so that the total solid content (e.g., amount) is 30% by weight, and then, the resultant solution was filtered through a PTFE membrane filter with a pore size of about 0.1 μm, thereby obtaining a liquid photosensitive resin composition.

2) Example 2

(Operation A) (Preparation of Silsesquioxane-Based Copolymer)

Trimethoxy(2-furanyl)silane (18.83 g, 0.10 mol), diphenyldimethoxysilane (73.31 g, 0.30 mol), methyltrimethoxysilane (27.24 g, 0.20 mol), tetramethoxysilane (45.67 g, 0.30 mol), 1,4-bis(triethoxysilane)benzene (40.26 g, 0.10 mol), propyleneglycolmonomethyletheracetate (200 g) were mixed in a 2 L flask equipped with a funnel, a cooling tube and a stirrer, and then the resultant solution was added with 20 g of 0.5 normal HCl aqueous solution as an acid catalyst while being stirred.

A reaction temperature was increased to 70° C., and stirring was performed for 18 hours. After finishing the reaction, distilled water was added and an organic phase was recovered through phase separation, thereby preparing 20 g of a silsesquioxane-based copolymer. A result of a GPC measurement demonstrated that the weight average molecular weight of the silsesquioxane-based copolymer was 8000.

(Operation B) (Production of Photosensitive Resin Composition)

In a state in which ultraviolet light was blocked, (a) 100 parts by weight of the silsesquioxane-based copolymer prepared in the operation A of Example 2 in terms of a solid content (e.g., amount) ratio, (b) 20 parts by weight of 4,4',4"-trihydroxyphenylmethane 1,2-naphthoquinonediazide-5-sulfonate as a photosensitive compound, and 0.5 parts by weight of a silicone-based surfactant were dissolved and diluted in (c) propyleneglycolmonomethyletheracetate as a solvent so that the total solid content (e.g., amount) is 30% by weight, and then, the resultant solution was filtered through a PTFE membrane filter with a pore size of about 0.1 μm, thereby obtaining a liquid photosensitive resin composition.

3) Example 3

(Operation A) (Preparation of Silsesquioxane-Based Copolymer)

3-(mercapto)propyltriethoxysilane (9.82 g, 0.05 mol), trimethoxy(2-furanyl)silane (9.42 g, 0.05 mol), diphenyldimethoxysilane (73.31 g, 0.30 mol), methyltrimethoxysilane (27.24 g, 0.20 mol), tetramethoxysilane (45.67 g, 0.30 mol), 1,4-bis(triethoxysilane)benzene (40.26 g, 0.10 mol), propyleneglycolmonomethyletheracetate (200 g) were mixed in a 2 L flask equipped with a funnel, a cooling tube and a stirrer, and then the resultant solution was added with 20 g of 0.5 normal HCl aqueous solution as an acid catalyst while being stirred.

A reaction temperature was increased to 70° C., and stirring was performed for 18 hours. After finishing the reaction, distilled water was added and an organic phase was recovered through phase separation, thereby preparing 20 g of a silsesquioxane-based copolymer. A result of a GPC measurement demonstrated that the weight average molecular weight of the silsesquioxane-based copolymer was 8000.

(Operation B) (Production of Photosensitive Resin Composition)

In a state in which ultraviolet light was blocked, (a) 100 parts by weight of the silsesquioxane-based copolymer prepared in the operation A of Example 3 in terms of a solid content (e.g., amount) ratio, (b) 20 parts by weight of 4,4',4"-trihydroxyphenylmethane 1,2-naphthoquinonediazide-5-sulfonate as a photosensitive compound, and 0.5 parts by weight of a silicone-based surfactant were dissolved and diluted in (c) propyleneglycolmonomethyletheracetate as a solvent so that the total solid content (e.g., amount) is 30% by weight, and then, the resultant solution was filtered through a PTFE membrane filter with a pore size of about 0.1 μm, thereby obtaining a liquid photosensitive resin composition.

4) Comparative Example 1

A polyimide (PI)-based photosensitive resin composition which is generally utilized as a pixel-defining film material was prepared. Polyimide having a monomer represented by Chemical Formula 6 instead of the silsesquioxane-based copolymer in the Examples was utilized as the polyimide-based photosensitive resin composition.

Chemical Formula 6

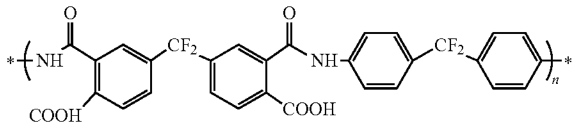

In some embodiments, a compound represented by Chemical Formula 7 was utilized as a photosensitive compound.

Chemical Formula 7

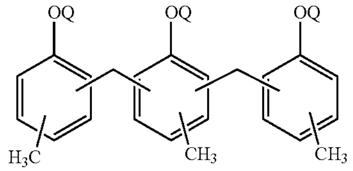

In Chemical Formula 7, Q is a substituent represented by Chemical Formula 8. The compound of Chemical Formula 7 may be referred to as ballast when Q is a hydrogen atom. Q represented by Chemical Formula 8 is included in an amount of about 75% with respect to the ballast.

Chemical Formula 8

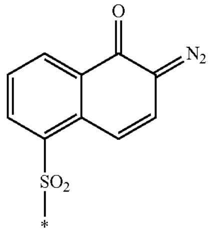

In Comparative Example 1, the photosensitive compound was utilized in an amount of about 20 parts by weight with respect to 100 parts by weight of polyimide, and was diluted in a solvent so that the total amount of solid content (e.g., amount) is 10% by weight, thereby preparing a polyimide-based photosensitive resin composition. A solvent obtained by mixing gammabutyrolactone, ethyllactate, and propyleneglycolmonomethyletheracetate in a weight ratio of 10:20:70 was utilized as a solvent.

2. Evaluation of Coated Film

The photosensitive resin compositions obtained in Examples 1 to 3, and Comparative Example 1 were spin-coated on a glass substrate, patterned to form a photosensitive resin film pattern, and heat-treated for an hour at a temperature of about 230° C. The obtained pixel-defining film was subjected to a physical property test, and the results are shown in Table 1.

(1) Evaluation of Pattern

After a sample was irradiated with energy of 100 mJ/cm$^2$ (I-line, 365 nm) by utilizing a 1:1 line-and-space photomask (for 3 μm to 300 μm) and a mask aligner (product name: SUSS MA-6) equipped with G, H, I-line UV lamps, development was performed for 60 seconds in a diluted alkaline aqueous solution having 2.38% TMAH, and washing was performed with ultrapure water. The pattern substrate thus obtained was heated in an oven at 230° C. for 30 minutes. A silicon wafer or glass substrate with patterns formed thereon was observed with an electron microscope, and a sample, in which a 5 μm pattern was formed without scum, was determined as "excellent or suitable", and a sample, in which a 5 μm pattern is not formed or scum occurred severely (to a great extent), was determined as "poor".

(2) Evaluation of Residual Film Rate

A residual film rate was calculated through Equation 1.

Residual Film Rate (%)=(Film Thickness after Development and Curing/Initial Thickness)×100   Equation 1

(3) Evaluation of Heat Resistance

While the temperature of a cured sample was increased at a rate of 10° C./min from room temperature to 600° C., the weight loss rate (loss wt %) at each temperature was measured by utilizing a thermogravimetric analyzer (device name: TGA, Perkin elmer Co.). A sample was determined as "excellent or suitable" if the weight loss rate at 400° C. is less than 20%, as "normal" if between 20% and 40%, and as "poor" if more than 40%.

(4) Evaluation of Chemical Resistance

After formation of a coated film, followed by curing, a sample was dipped in a PR peeling solution (product name, LT-360) at 40° C. for 10 minutes, and the film thickness swelling change rate was measured. A sample was determined as "excellent or suitable" if the swelling change rate is less than 5%, and determined as "poor" if the swelling change rate is 5% or more.

(5) Evaluation of Dielectric Constant

After formation of a coated film on an ITO substrate, followed by curing, a metal-insulator-metal (MIM) evaluation cell was manufactured by depositing an aluminum electrode having a diameter of 1.0. To measure a dielectric constant, the capacitance (C) of a coated resist film was measured for the evaluation cell by utilizing an LCR-meter (Agilant Co. 4284), and the dielectric constant was calculated through Equation 2. In Equation 2, d is a thickness of the resist film, A is an area of the deposited electrode, $\varepsilon_0$ is a dielectric constant in vacuum ($8.855\times10^{-12}$ F/m), and $\varepsilon$ is a dielectric constant of the resist film to be obtained.

$$C=(\varepsilon_0\varepsilon A)/d \qquad \text{Equation 2}$$

(6) Evaluation of Moisture Absorption Rate

After formation of a coated film, followed by curing, a sample was dipped in distilled water at room temperature for 72 hours, the film thickness swelling change rate was measured. A sample was determined as "excellent or suitable" if the swelling change rate is less than 2%, and determined as "poor" if the swelling change rate is 2% or more.

TABLE 1

| Classification | Pattern | Residual film rate (%) | Heat resistance | Chemical resistance | Dielectric constant | Moisture absorption rate |
|---|---|---|---|---|---|---|
| Example 1 | excellent or suitable | 84 | excellent or suitable | excellent or suitable | 3.31 | excellent or suitable |
| Example 2 | excellent or suitable | 86 | excellent or suitable | excellent or suitable | 3.29 | excellent or suitable |
| Example 3 | excellent or suitable | 85 | excellent or suitable | excellent or suitable | 3.30 | excellent or suitable |
| Comparative Example 1 | poor | 71 | poor | poor | 3.61 | poor |

Referring to Table 1, it may be seen that Examples 1 to 3, according to the present disclosure utilizing polysilsesquioxane which is a copolymer formed by copolymerizing first to fourth monomers, have not only an excellent and improved heat resistance and chemical resistance, but also an excellent and improved residual film rate, pattern resolution, and sensitivity, compared to Comparative Example 1 which utilizes polyimide. Here, Examples 1 to 3 each formed of a photosensitive resin composition according to an embodiment exhibit lower dielectric characteristics and lower moisture absorption rate than Comparative Example 1, so that excellent or suitable reliability of an element may be expected.

Figure 6A:
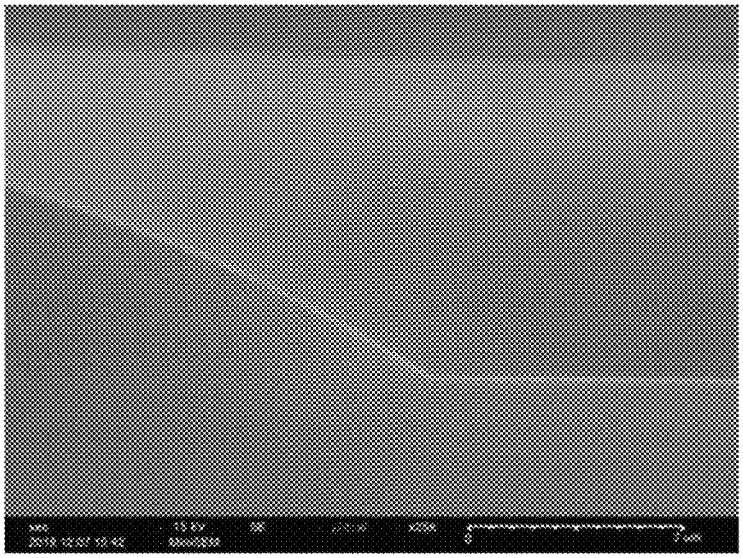
FIG. 6A is a scanning electron micrograph showing a cross-section of a pixel-defining film formed by utilizing a photosensitive resin composition according to an embodiment of the present disclosure.

FIG. 6A is a scanning electron micrograph showing a cross-section of a pixel-defining film formed utilizing a photosensitive resin composition according to an embodiment of the present disclosure. FIG. 6A illustrates an evaluation result of a tapered angle with respect to a pixel-defining film formed of the photosensitive resin composition of Example 1 according to the present disclosure. The tapered angle was measured as a bonding angle between the pixel-defining film and the substrate in the scanning electron microscope. The tapered angle was measured as 30°, and it may be confirmed that a pattern was formed without residue as in FIG. 6A. Through this, it may be seen that the photosensitive resin composition according to an embodiment has excellent or suitable development characteristics, thereby showing high-resolution and sensitivity characteristics.

Figure 6B:
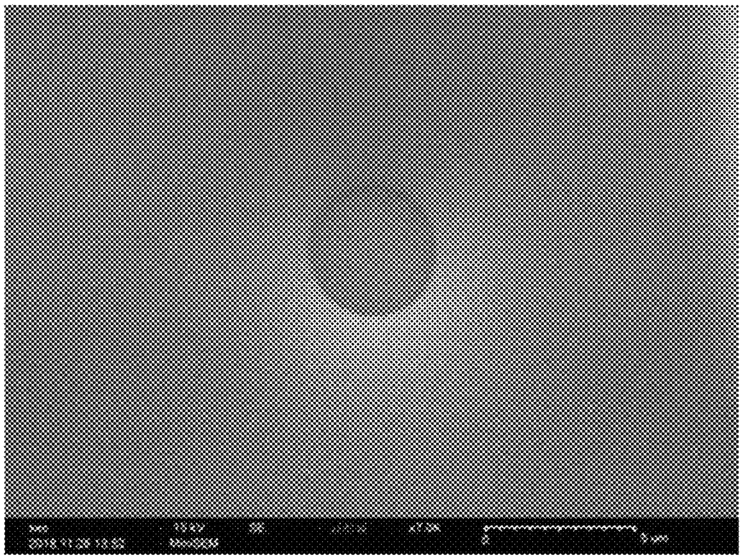
FIG. 6B is a scanning electron micrograph showing a plane of an organic insulating layer formed utilizing a photosensitive resin composition according to an embodiment of the present disclosure.

FIG. 6B is a scanning electron micrograph showing a flat surface of an organic insulating layer formed utilizing the photosensitive resin composition according to an embodiment of the present disclosure. FIG. 6B illustrates an image obtained by photographing, with a scanning electron microscope, a flat surface of an organic insulating layer formed of the photosensitive resin composition according to Example 1 of the present disclosure. Referring to FIG. 6B, it may be confirmed that a 24 μm contact hole pattern is removed without residue. Through this, it may be seen that the photosensitive resin composition according to an embodiment has excellent or suitable development characteristics, thereby showing high-resolution and sensitivity characteristics.

Through FIGS. 6A and 6B, it may be confirmed that the photosensitive resin composition according to an embodiment includes a silsesquioxane-based copolymer formed by copolymerizing first to fourth monomers different from each other, and therefore a pattern with high-sensitivity and resolution may be formed.

Figure 7:
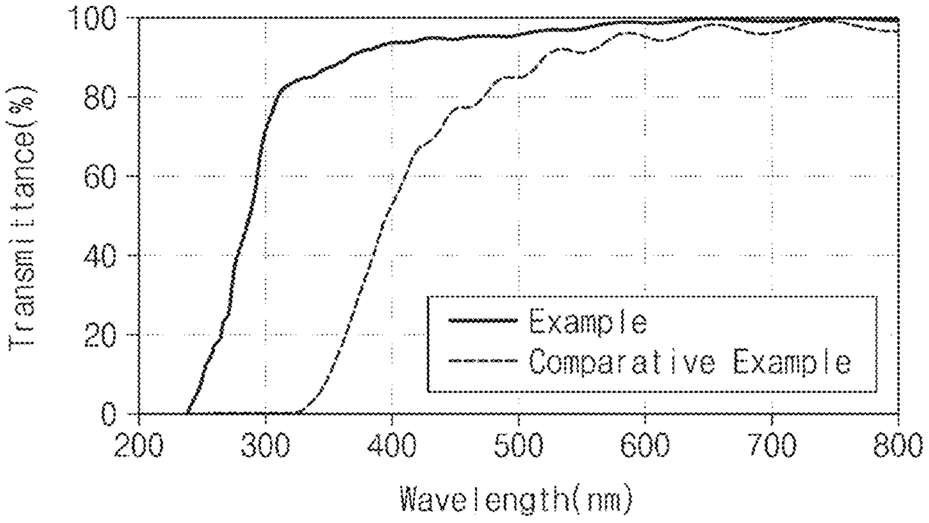
FIG. 7 shows a transmittance versus a wavelength of a single film formed utilizing photosensitive resin compositions according to an example of the present disclosure, and a comparative example.

FIG. 7 is a diagram showing a transmittance result versus a wavelength of single films formed utilizing the photosensitive resin compositions according to Example according to of the present disclosure and Comparative Example. FIG. 7 illustrates that transmittances (%) in ultraviolet and visible ranges are measured for single films formed utilizing the photosensitive resin compositions obtained in Example 1 and Comparative Example 1. Referring to FIG. 7, it may be confirmed that transmittances in ultraviolet and visible ranges in Example 1 are all higher than those in Comparative Example. Through this, it may be expected that a single film formed of the photosensitive resin composition according to Example 1 has higher transparency than Comparative Example, and improves sensitivity during exposure, thereby achieving a high-resolution pattern.

Figure 8A:
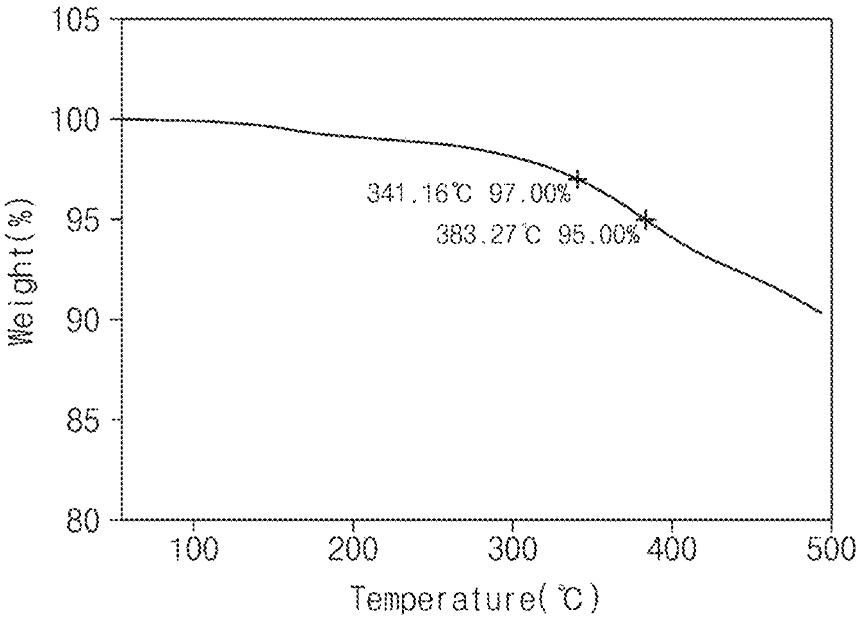
FIGS. 8A and 8B show results of the heat-resistance of a single film formed utilizing photosensitive resin compositions according to an example of the present disclosure, and a comparative example, as measured with a thermogravimetric analyzer.
Figure 8B:
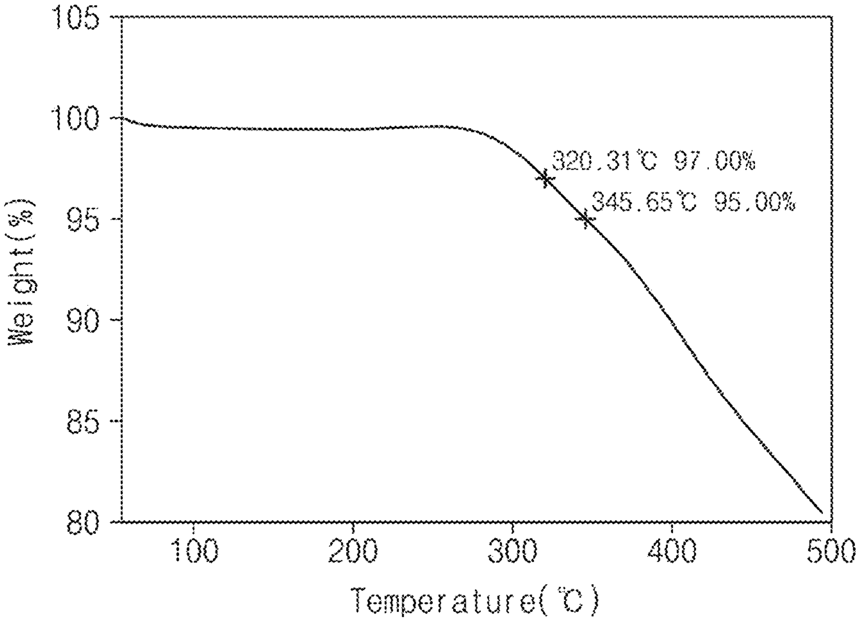

FIGS. 8A and 8B are results showing that heat resistances of single films formed utilizing the photosensitive resin compositions according to Example 1 of the present disclosure and Comparative Example, respectively, are measured utilizing a thermogravimetric analyzer. FIG. 8A shows an evaluation result of weight change versus temperature for a single film formed of the photosensitive resin composition according to Example 1 of the present disclosure. FIG. 8B shows an evaluation result of weight change versus temperature for a single film formed of the photosensitive resin composition according to Comparative Example 1.

Referring to FIG. 8A, it may be confirmed that weight decrease in the single film formed of the photosensitive resin composition according to Example slowly starts at 341.16° C., and 5% or less of weight decrease is shown at 383.27° C. In contrast, it may be confirmed that weight decrease in the single film formed of the photosensitive resin composition according to Comparative Example slowly starts at 320.31° C., about 5% of weight decrease is shown at 345.65° C., and thereafter a sharp weight decrease is shown. Through this, it may be seen that the single film formed of the photosensitive resin composition according to Example has an excellent or improved thermal stability compared to the single film formed of the photosensitive resin composition according to Comparative Example.

Hereinafter, referring to FIGS. 9, and 10A to 10E, a manufacturing method of a display device utilizing a photosensitive resin composition according to an embodiment of the present disclosure will be described. The above description of the display device according to an embodiment may be applied to a display device in the description of a manufacturing method of a display device according to an embodiment. Hereinafter, in the description of a manufacturing method of a display device according to an embodiment, duplicate description of the display device according to an embodiment will not be described again, and the following description will primarily focus on differences.

Figure 9:
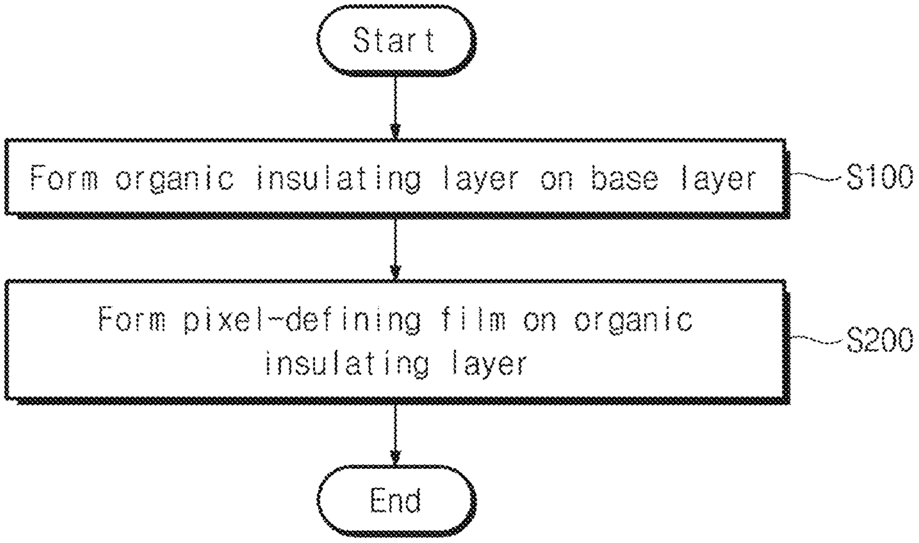
FIG. 9 is a flowchart illustrating a manufacturing method of a display device according to an embodiment.

FIG. 9 is a flowchart showing a manufacturing method of a display device according to an embodiment. FIGS. 10A to 10E are diagrams schematically illustrating manufacturing operations of a display device according to an embodiment.

Referring to FIG. 9, a manufacturing method of a display device according to an embodiment includes an operation (S100) of forming an organic insulating layer on a base layer, and an operation (S200) of forming a pixel-defining film on the organic insulating film.

Figure 10A:
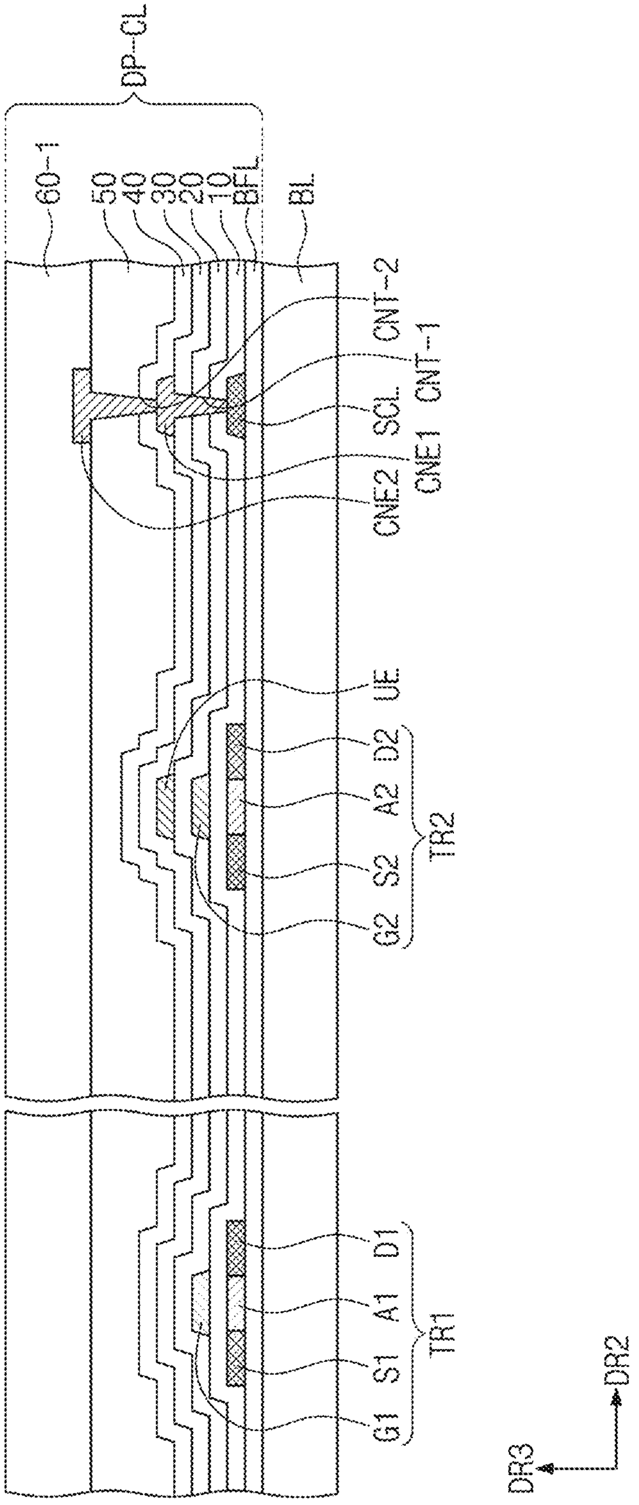
FIGS. 10A-10E are diagrams schematically illustrating operations for manufacturing a display device according to an embodiment.
Figure 10B:
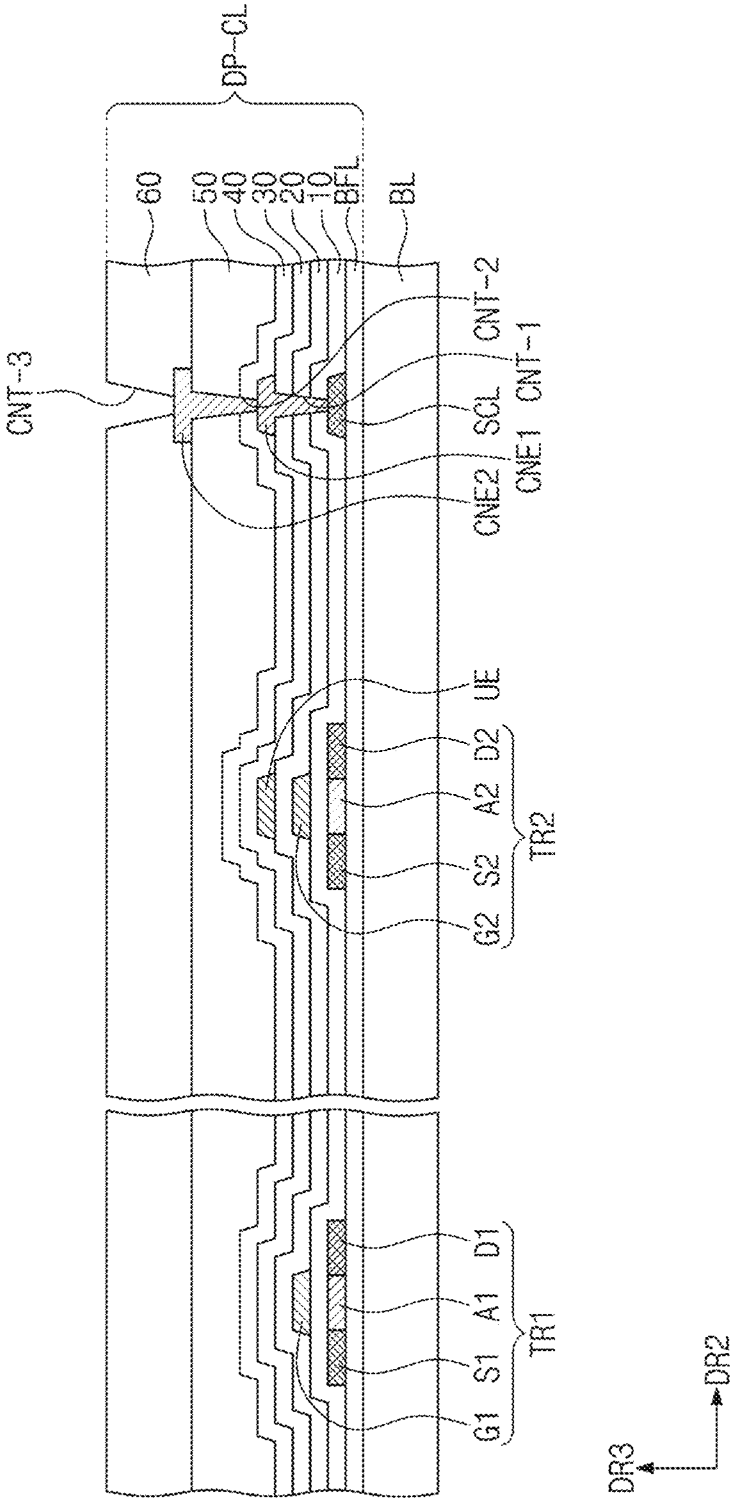
Figure 10C:
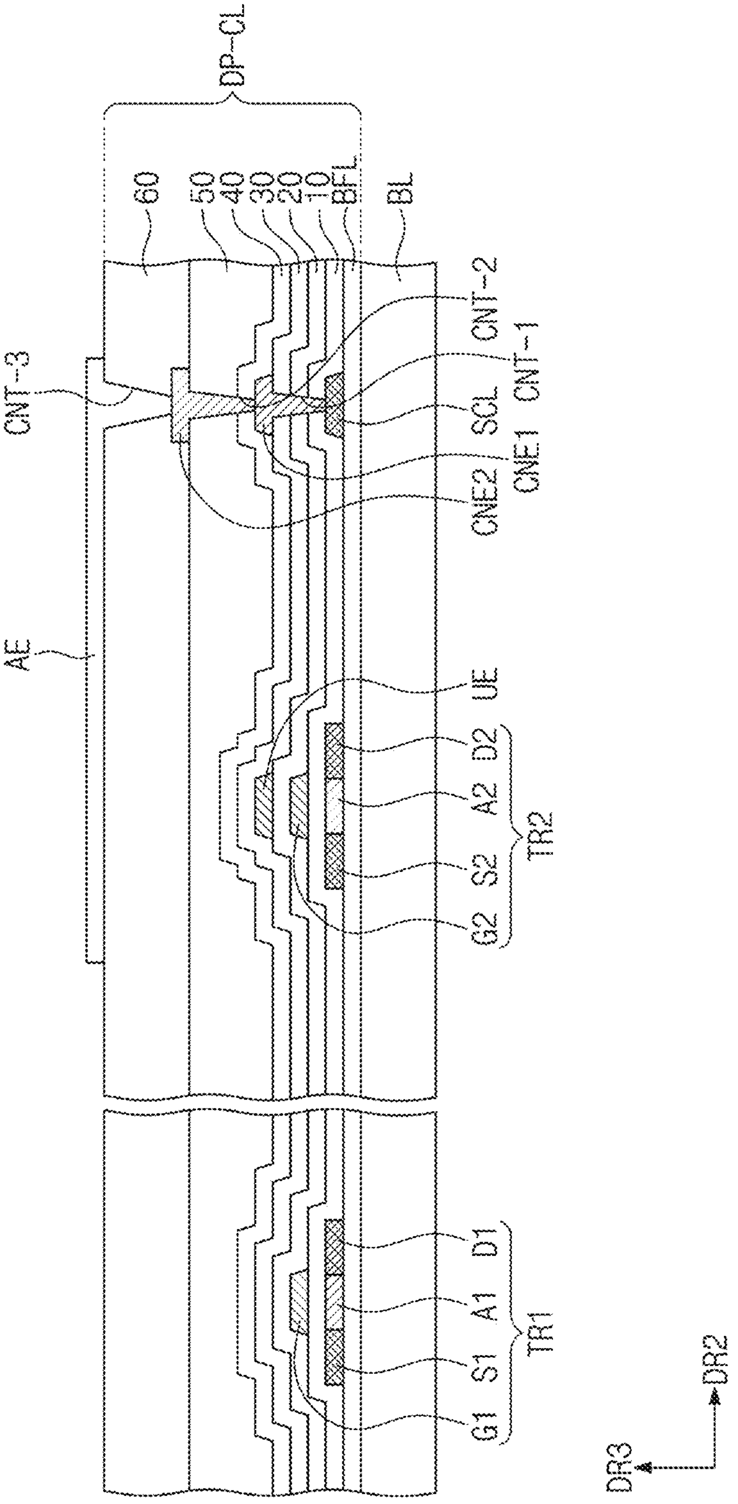
Figure 10D:
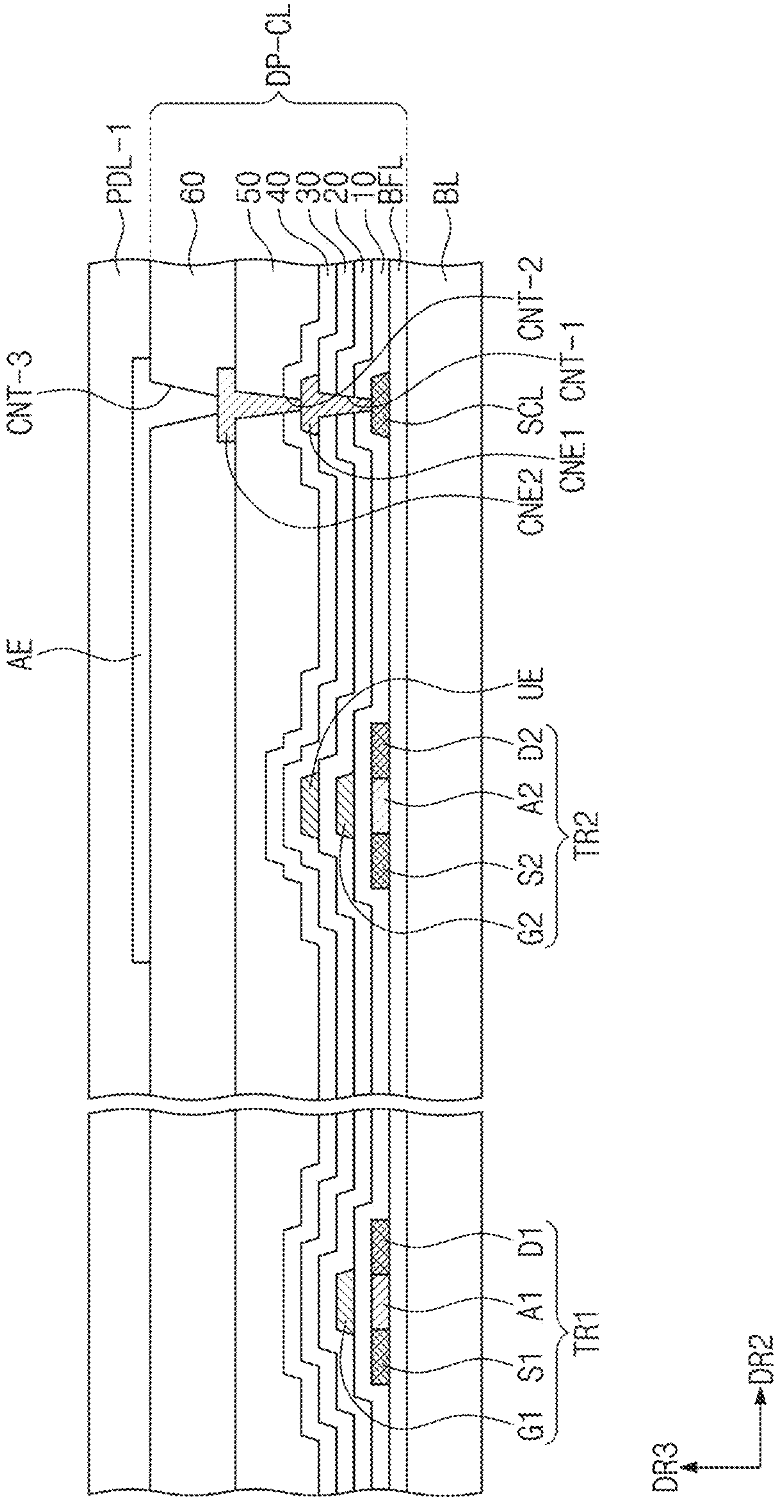
Figure 10E:
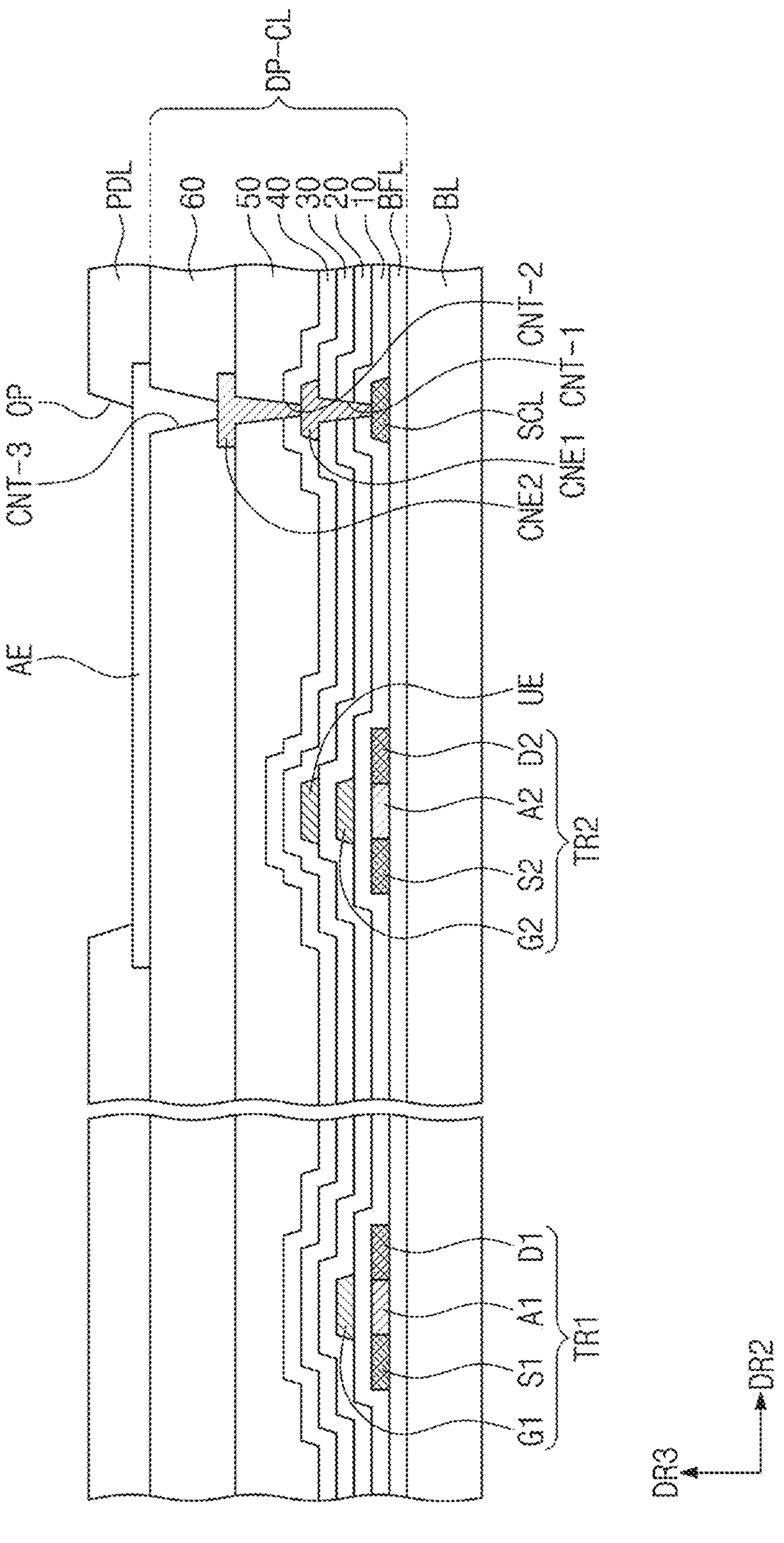

FIGS. 10A to 10E are cross-sectional views sequentially illustrating operations of the manufacturing method of a display device according to an embodiment. FIGS. 10A to 10E sequentially illustrate operations of forming a sixth insulating layer 60 among first to sixth insulating layers 10, 20, 30, 40, 50, and 60 and a pixel-defining film PDL in a cross-section corresponding to FIG. 5. FIG. 10A illustrates an operation of providing a photosensitive resin composition according to an embodiment for forming the sixth insulating layer 60, FIG. 10B illustrates an operation of forming a contact hole CNT-3 of the sixth insulating layer 60, FIG. 10C illustrates an operation of forming a first electrode AE on the sixth insulating layer 60, FIG. 10D illustrates an operation of providing the photosensitive resin composition according to an embodiment for forming the pixel-defining film PDL, and FIG. 10E illustrates an operation of forming an opening OP of the pixel-defining film PDL. In some embodiments, in FIGS. 10A to 10E, the operation of forming the sixth insulating layer 60 is illustrated, but an embodiment of the present disclosure is not limited thereto. An operation of forming at least one organic insulating layer among first to fifth insulating layers 10, 20, 30, 40, and 50 may be also performed utilizing the manufacturing method according to an embodiment of the present disclosure.

Referring to FIG. 10A, the photosensitive resin composition according to an embodiment of the present disclosure may be provided on a base layer BL. For example, a preliminary organic insulating layer 60-1 may be formed by coating the base layer BL with the photosensitive resin composition according to an embodiment of the present disclosure. The photosensitive resin composition according to an embodiment may be provided after forming a second connecting electrode CNE2 on a fifth insulating layer 50. Various suitable methods such as spin coating, chemical vapor deposition, spraying, and roll coating may be utilized as a coating method of the photosensitive resin composition. The photosensitive resin composition according to an embodiment may be a positive photosensitive resin composition.

Referring to FIG. 10B, an operation of selectively exposing and developing the preliminary inorganic insulating layer 60-1 may be performed. In the operation of forming the sixth insulating layer 60 by selectively exposing and developing the preliminary organic insulating layer 60-1, a part of the sixth insulating layer 60 may be removed to form a contact hole CNT-3. For example, after the operation of exposing the preliminary organic insulating layer 60-1, a development process may be performed by utilizing an alkaline developer. During the development, a part of the preliminary organic insulating layer 60-1 irradiated with light may be removed and thus the contact hole CNT-3 is formed, and the other part not irradiated with light may remain as a pattern. In some embodiments, a heat treatment process may be performed before exposing the preliminary organic insulating layer 60-1. The heat treatment process may correspond to a pre-baking process for the preliminary organic insulating layer 60-1. The solvent in the photosensitive resin composition may be removed through the pre-baking process.

Referring to FIG. 10C, after forming the contact hole CNT-3, a first electrode AE may be formed on the sixth insulating layer 60. A part of the first electrode AE may be connected to the second connecting electrode CNE2 via the contact hole CNT-3.

Referring to FIG. 10D, the photosensitive resin composition according to an embodiment of the present disclosure may be provided on the sixth insulating layer 60. For example, a preliminary pixel-defining film PDL-1 may be formed by coating the sixth insulating layer 60 with the photosensitive resin composition according to an embodiment of the present disclosure. Various suitable methods such as spin coating, chemical vapor deposition, spraying, and roll coating may be utilized as a coating method of the photosensitive resin composition according to an embodiment. The photosensitive resin composition according to an embodiment may be a positive photosensitive resin composition.

Referring to FIG. 10E, the operation of selectively exposing and developing the preliminary pixel-defining film PDL-1 may be performed. In the operation of forming the pixel-defining film PDL by selectively exposing and developing the preliminary pixel-defining film PDL-1, a part of the pixel-defining film PDL may be removed to form the opening OP. For example, after the operation of exposing the pixel-defining film PDL-1, a development process may be performed by utilizing an alkaline developer. During the development, a part of the preliminary pixel-defining film PDL-1 irradiated with light may be removed and thus the opening OP is formed, and the other part not irradiated with light may remain as a pattern. In some embodiments, a heat treatment process may be performed before exposing the preliminary pixel-defining film PDL-1. The heat treatment process may correspond to a pre-baking process of the preliminary pixel-defining film PDL-1. The solute in the photosensitive resin composition may be removed through the pre-baking process.

A photosensitive resin composition composed of polyimide and a naphthoquinonediazide compound reduces the dissolution reduction effect of the quinonediazide due to the excessively high alkali solubility of a polyamic acid precursor, thereby causing film shrinkage to be increased and sensitivity and resolution to be degraded. In some embodiments, because polyimide has low light transmittance in the visible light range and has an excessively rigid skeletal structure, it is difficult to control pattern residue or development characteristics. For this reason, much energy for exposing is required during patterning, which leads to an increase in thickness loss during development, so that it is difficult to improve distribution.

A photosensitive resin composition according to an embodiment of the present disclosure may include a silsesquioxane copolymer formed by copolymerizing a first monomer, a second monomer, a third monomer, and a fourth monomer which are different in type or kind from each other. For example, because the first monomer including at least one of a mercapto group or a furanyl group which is a hydrophilic substituent, and the second monomer including an alkyl group or an aryl group which is a hydrophobic substituent are utilized, alkali development characteristics may be easily controlled or selected. Accordingly, high-sensitivity and resolution pattern may be achieved. In some embodiments, because the third monomer and the fourth monomer which have a symmetric structure are introduced, the molecular weight of the silsesquioxane-based copolymer may be easily controlled or selected, thereby improving heat resistance and chemical resistance of a thin film.

A photosensitive resin composition according to an embodiment of the present disclosure includes a silsesquioxane-based copolymer obtained by copolymerizing a first monomer, a second monomer, a third monomer, and a fourth monomer which are different from each other, thereby showing high-sensitively, high-resolution, high heat resistance, high transparency, and low dielectric characteristics.

In a manufacturing method of a display device according to an embodiment, a photosensitive resin composition including a silsesquioxane-based copolymer obtained by copolymerizing a first monomer, a second monomer, a third monomer, and a fourth monomer which are different from each other is utilized, and therefore a display device may be provided which includes an organic insulating layer having high-sensitivity, high-resolution, high heat resistance, high transparency, and low dielectric characteristics.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, expressions such as "at least one of", "one of", and "selected from", when preceding a list of elements, modify the entire list of elements and do not modify the individual elements of the list. For example, "at least one of a, b or c" may indicate only a, only b, only c, both (e.g., simultaneously) a and b, both (e.g., simultaneously) a and c, both (e.g., simultaneously) b and c, all of a, b, and c, or variations thereof.

The display device and/or any other relevant devices or components according to embodiments of the present invention described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In the above, description has been made with reference to preferred embodiments of the present disclosure, but those skilled in the art or those of ordinary skill in the relevant technical field may understand that one or more suitable modifications and changes may be made to the present disclosure within the scope not departing from the spirit and the technology scope of the present disclosure described in the appended claims. Therefore, the technical scope of the present disclosure is not limited to the contents described in the detailed description of the disclosure, but should be determined by the claims, and equivalents thereof.

What is claimed is:

1. A photosensitive resin composition comprising:

a silsesquioxane-based copolymer obtained by copolymerizing:

a first monomer, a second monomer represented by Chemical Formula 2, a third monomer represented by Chemical Formula 3, and a fourth monomer represented by Chemical Formula 4; and a quinonediazide-based photosensitive compound, $(R_4)_n$—$Si(R_5)_{4-n}$ Chemical Formula 2

$Si(R_6)_4$ Chemical Formula 3

$(R_7)_3$—Si—$R_8$—Si—$(R_7)_3$ Chemical Formula 4 wherein, in Chemical Formulas 2 to 4, $R_5$ to $R_7$ are each independently a substituted or unsubstituted alkoxy group having one to three carbon atoms, $R_4$ is a substituted or unsubstituted alkyl group having one to three carbon atoms, or a substituted or unsubstituted aryl group having six to twelve ring-forming carbon atoms, $R_8$ is a substituted or unsubstituted arylene group having six to twelve ring-forming carbon atoms, and n is an integer from one to three, and wherein the first monomer, the second monomer, the third monomer, and the fourth monomer are different from each other, wherein the third monomer comprises at least one of tetramethoxysilane, tetraethoxysilane, or tetrapropoxysilane, wherein the first monomer comprises a (1-1)-st monomer and a (1-2)-nd monomer different from the (1-1)-st monomer, and the (1-1)-st monomer is represented by Chemical Formula 1-1, and the (1-2)-nd monomer is represented by Chemical Formula 1-2, $R_1$—$R_2$—$Si(R_3)_3$ Chemical Formula 1-1

$R_1$—$R_2$—$Si(R_3)_3$, and Chemical Formula 1-2 wherein, in Chemical Formula 1-1 and Chemical Formula 1-2, $R_{1-1}$ is a substituted or unsubstituted mercapto group, $R_{1-2}$ is a substituted or unsubstituted furanyl group, $R_2$ is a direct linkage, or a substituted or unsubstituted divalent alkyl group having three to six carbon atoms, and $R_3$ is a substituted or unsubstituted alkoxy group having one to three carbon atoms.

2. The photosensitive resin composition of claim 1, wherein the silsesquioxane-based copolymer has a weight average molecular weight of about 5000 to about 15000.

3. The photosensitive resin composition of claim 1, wherein the silsesquioxane-based copolymer has a dispersity of about 2.0 to about 4.0.

4. The photosensitive resin composition of claim 1, wherein the silsesquioxane-based copolymer comprises a repeating unit in which the combination order of the first monomer, the second monomer, the third monomer, and the fourth monomer is random.

5. The photosensitive resin composition of claim 1, wherein the second monomer represented by Chemical Formula 2 is represented by Chemical Formula 2-1 or Chemical Formula 2-2, $R_4$—$Si(R_5)_3$ Chemical Formula 2-1

$(R_4)_2$—$Si(R_5)_2$, and Chemical Formula 2-2 wherein, in Chemical Formula 2-1 and Chemical Formula 2-2, $R_4$ and $R_5$ are the same as defined in Chemical Formula 2.

6. The photosensitive resin composition of claim 1, wherein the first monomer comprises 3-(mercapto)propyltrimethoxysilane and trimethoxy (2-furanyl) silane.

7. The photosensitive resin composition of claim 1, wherein the second monomer comprises at least one of methyltrimethoxysilane, propyltrimethoxysilane, phenyltrimethoxysilane, diphenyldimethoxysilane, or diphenyldiethoxysilane.

8. The photosensitive resin composition of claim 1, wherein the fourth monomer comprises at least one of 1,4-bis(triethoxysilyl)benzene, 1,3bis(triethoxysilyl)benzene, or 4,4-bis(triethoxysilyl)-1,1'-biphenyl.

9. The photosensitive resin composition of claim 1, wherein the silsesquioxane-based copolymer comprises a repeating unit represented by Chemical Formula 5, Chemical Formula 5

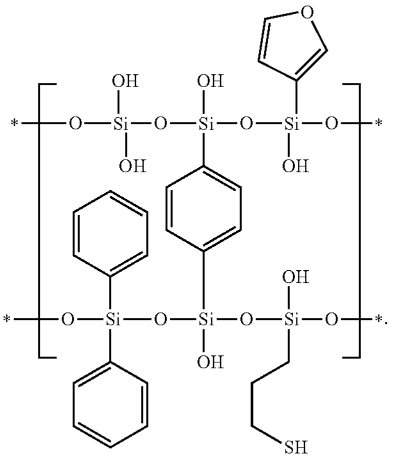

10. The photosensitive resin composition of claim 1, wherein, with respect to the total amount of the first monomer, the second monomer, the third monomer, and the fourth monomer, about 5% to about 25% by weight of the first monomer, about 20% to about 60% by weight of the second monomer, about 20% to about 40% by weight of the third monomer, and about 5% to about 25% by weight of the fourth monomer are included.

11. The photosensitive resin composition of claim 1, further comprising a glycol-based solvent, wherein, with respect to the total amount of the photosensitive resin composition, about 10% to about 40% by weight of the silsesquioxane-based copolymer, about 5% to about 20% by weight of the quinonediazide-based photosensitive compound, and about 40% to about 85% by weight of the glycol-based solvent are included.

12. The photosensitive resin composition of claim 11, wherein the quinonediazide-based photosensitive compound comprises at least one of 1,4-benzenediol, 1,2-benzenediol, 4,4'-dihydroxy-biphenyl, bisphenol-A, α,α-bis(4-hydroxyphenyl)-4-(4-hydroxy-α,α-dimethylbenzyl)-ethylbenzene, or 4,4',4"-trihydroxyphenylmethane which contains, as a substituent, a naphthoquinone-1,2-diazide-4-sulfonic acid ester group or a naphthoquinone-1,2-diazide-5-sulfonic acid ester group.

13. The photosensitive resin composition of claim 11, wherein the glycol-based solvent comprises at least one of butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

14. A photosensitive resin composition comprising:

a silsesquioxane-based copolymer obtained by copolymerizing a first monomer, a second monomer, a third monomer, and a fourth monomer, which are different from each other;

a quinonediazide-based photosensitive compound;

a surfactant; and a glycol-based solvent, wherein the third monomer is represented by Chemical Formula 3, $Si(R_6)_4$, and Chemical Formula 3 wherein $R_6$ is a substituted or unsubstituted alkoxy group having one to three carbon atoms, wherein the third monomer comprises at least one of tetramethoxysilane, tetraethoxysilane, or tetrapropoxysilane, wherein the first monomer comprises a (1-1)-st monomer and a (1-2)-nd monomer different from the (1-1)-st monomer, and the (1-1)-st monomer is represented by Chemical Formula 1-1, and the (1-2)-nd monomer is represented by Chemical Formula 1-2, $R_1—R_2—Si(R_3)_3$ Chemical Formula 1-1

$R_1—R_2—Si(R_3)_3$, and Chemical Formula 1-2 wherein, in Chemical Formula 1-1 and Chemical Formula 1-2, $R_{1-1}$ is a substituted or unsubstituted mercapto group, $R_{1-2}$ is a substituted or unsubstituted furanyl group, $R_2$ is a direct linkage, or a substituted or unsubstituted divalent alkyl group having three to six carbon atoms, and $R_3$ is a substituted or unsubstituted alkoxy group having one to three carbon atoms.

15. The photosensitive resin composition of claim 14, wherein the second monomer is represented by Chemical Formula 2, and the fourth monomer is represented by Chemical Formula 4, $(R_4)_n—Si(R_5)_{4-n}$ Chemical Formula 2

$(R_7)_3—Si—R_8—Si—(R_7)_3$, and Chemical Formula 4 wherein, in Chemical Formulas 2 to 4, $R_4$ is a substituted or unsubstituted alkyl group having one to three carbon atoms, or a substituted or unsubstituted aryl group having six to twelve ring-forming carbon atoms, $R_5$ and $R_7$ are each independently a substituted or unsubstituted alkoxy group having one to three carbon atoms, $R_8$ is a substituted or unsubstituted arylene group having six to twelve ring-forming carbon atoms, and n is an integer from one to three.

16. A manufacturing method of a display device, the manufacturing method comprising:

forming an organic insulating layer on a base layer; and forming a pixel-defining film on the organic insulating layer, wherein at least one of the organic insulating layer or the pixel-defining film is formed of a photosensitive resin composition, and the photosensitive resin composition comprises a silsesquioxane-based copolymer obtained by copolymerizing a first monomer comprising a (1-1)-st monomer and a (1-2)-nd monomer different from the (1-1)-st monomer, the (1-1)-st monomer being represented by Chemical Formula 1-1, and the (1-2)-nd monomer being represented by Chemical Formula 1-2, a second monomer represented by Chemical Formula 2, a third monomer represented by Chemical Formula 3, and a fourth monomer represented by Chemical Formula 4, $R_{1-1}—R_2—Si(R_3)_3$ Chemical Formula 1-1

$R_{1-2}—R_2—Si(R_3)_3$ Chemical Formula 1-2

$(R_4)_n—Si(R_5)_{4-n}$ Chemical Formula 2

$Si(R_6)_4$ Chemical Formula 3

$(R_7)_3—Si—R_8—Si—(R_7)_3$, and Chemical Formula 4 wherein, in Chemical Formulas 1-1, 1-2, and 2 to 4, $R_2$ is a direct linkage, or a substituted or unsubstituted divalent alkyl group having three to six carbon atoms, $R_3$, and $R_5$ to $R_7$ are each independently a substituted or unsubstituted alkoxy group having one to three carbon atoms, $R_4$ is a substituted or unsubstituted alkyl group having one to three carbon atoms, or a substituted or unsubstituted aryl group having six to twelve ring-forming carbon atoms, $R_8$ is a substituted or unsubstituted arylene group having six to twelve ring-forming carbon atoms, and n is an integer from one to three, $R_{1-1}$ is a substituted or unsubstituted mercapto group, and $R_{1-2}$ is a substituted or unsubstituted furanyl group.

17. The manufacturing method of claim 16, wherein the forming of the organic insulating layer comprises:

forming a preliminary organic insulating layer by coating the base layer with the photosensitive resin composition; and selectively exposing and developing the preliminary organic insulating layer.

18. The manufacturing method of claim 16, wherein the forming of the pixel-defining film comprises:

forming a preliminary pixel-defining film by coating the organic insulating layer with the photosensitive resin composition; and selectively exposing and developing the preliminary pixel-defining film.

* * * * *